US012300650B2

(12) United States Patent
Nakatsuka

(10) Patent No.: US 12,300,650 B2
(45) Date of Patent: May 13, 2025

(54) SEMICONDUCTOR MEMORY DEVICE

(71) Applicant: Kioxia Corporation, Tokyo (JP)

(72) Inventor: Keisuke Nakatsuka, Kobe (JP)

(73) Assignee: Kioxia Corporation, Tokyo (JP)

( * ) Notice: Subject to any disclaimer, the term of this patent is extended or adjusted under 35 U.S.C. 154(b) by 197 days.

(21) Appl. No.: 18/065,212

(22) Filed: Dec. 13, 2022

(65) Prior Publication Data

US 2023/0395546 A1 Dec. 7, 2023

(30) Foreign Application Priority Data

Jun. 3, 2022 (JP) .................................. 2022-090696

(51) Int. Cl.
| | |
|---|---|
| *H01L 23/00* | (2006.01) |
| *G11C 16/16* | (2006.01) |
| *H01L 25/065* | (2023.01) |
| *H01L 25/18* | (2023.01) |

(52) U.S. Cl.
CPC .............. *H01L 24/08* (2013.01); *G11C 16/16* (2013.01); *H01L 25/0657* (2013.01); *H01L 25/18* (2013.01); *H01L 2224/08145* (2013.01); *H01L 2924/1431* (2013.01); *H01L 2924/14511* (2013.01)

(58) Field of Classification Search
CPC ..... H01L 24/08; H01L 25/0657; H01L 25/18; H01L 2224/08145; H01L 2924/1431; H01L 2924/14511; G11C 16/16
See application file for complete search history.

(56) References Cited

U.S. PATENT DOCUMENTS

| | | | | |
|---|---|---|---|---|
| 10,074,667 | B1* | 9/2018 | Higashi | ................. H10B 41/23 |
| 10,297,578 | B2* | 5/2019 | Tagami | ................... H01L 24/08 |
| 11,641,738 | B2* | 5/2023 | Yang | ..................... H10B 43/27 |
| | | | | 257/314 |
| 2018/0261575 | A1 | 9/2018 | Tagami et al. | |
| 2018/0261623 | A1 | 9/2018 | Higashi et al. | |
| 2019/0312012 | A1 | 10/2019 | Tagami et al. | |
| 2020/0350291 | A1 | 11/2020 | Tagami et al. | |
| 2022/0157353 | A1 | 5/2022 | Kim et al. | |
| 2022/0157784 | A1 | 5/2022 | Tagami et al. | |

FOREIGN PATENT DOCUMENTS

| | | |
|---|---|---|
| JP | 2018-148071 A | 9/2018 |
| JP | 2018-152419 A | 9/2018 |

* cited by examiner

*Primary Examiner* — Son L Mai

(74) *Attorney, Agent, or Firm* — Oblon, McClelland, Maier & Neustadt, L.L.P.

(57) ABSTRACT

According to one embodiment, in a semiconductor memory device, the first chip has plural memory cells provided at plural intersection positions where the plural first conductive layers and the plural first semiconductor films intersect each other. The second chip has plural memory cells provided at plural intersection positions where the plural second conductive layers and the plural second semiconductor films intersect each other. A first connection configuration and a second connection configuration are insulated from each other. The first connection configuration reaches the third chip from a first conductive layer that a tip of the first semiconductor film reaches among the plural first conductive layers. The second connection configuration reaches the third chip from a second conductive layer that a tip of the second semiconductor film reaches among the plural second conductive layers.

20 Claims, 9 Drawing Sheets

SEMICONDUCTOR MEMORY DEVICE

CROSS-REFERENCE TO RELATED APPLICATIONS

This application is based upon and claims the benefit of priority from Japanese Patent Application No. 2022-090696, filed on Jun. 3, 2022; the entire contents of which are incorporated herein by reference.

FIELD

Embodiments described herein relate generally to a semiconductor memory device.

BACKGROUND

In a semiconductor memory device having a memory cell array, data may be erased with respect to the memory cell array. In the semiconductor memory device, a predetermined function is implemented in an erasing process.

DETAILED DESCRIPTION

In general, according to one embodiment, there is provided a semiconductor memory device including a first chip, a second chip and a third chip. The second chip is bonded to the first chip. The third chip is bonded to the second chip on an opposite side of the first chip. The first chip includes plural first conductive layers, plural first semiconductor films, and plural first insulating films. The plural first conductive layers are stacked with a first insulating layer interposed therebetween. Each of the plural first semiconductor films extends in a stack direction through the plural first conductive layers. Each of the plural first insulating films is disposed between the plural first conductive layers and the first semiconductor film. The first chip has plural memory cells provided at plural intersection positions where the plural first conductive layers and the plural first semiconductor films intersect each other. The second chip includes plural second conductive layers, plural second semiconductor films, and plural second insulating films. The plural second conductive layers are stacked with a second insulating layer interposed therebetween. Each of the plural second semiconductor films extends in the stack direction through the plural second conductive layers. Each of plural second insulating films is disposed between the plural second conductive layers and the second semiconductor film. The second chip has plural memory cells provided at plural intersection positions where the plural second conductive layers and the plural second semiconductor films intersect each other. A first connection configuration and a second connection configuration are insulated from each other. The first connection configuration reaches the third chip from a first conductive layer that a tip of the first semiconductor film reaches among the plural first conductive layers. The second connection configuration reaches the third chip from a second conductive layer that a tip of the second semiconductor film reaches among the plural second conductive layers.

Exemplary embodiments of a semiconductor memory device will be explained below in detail with reference to the accompanying drawings. The present invention is not limited to the following embodiments.

Embodiment

Figure 1:
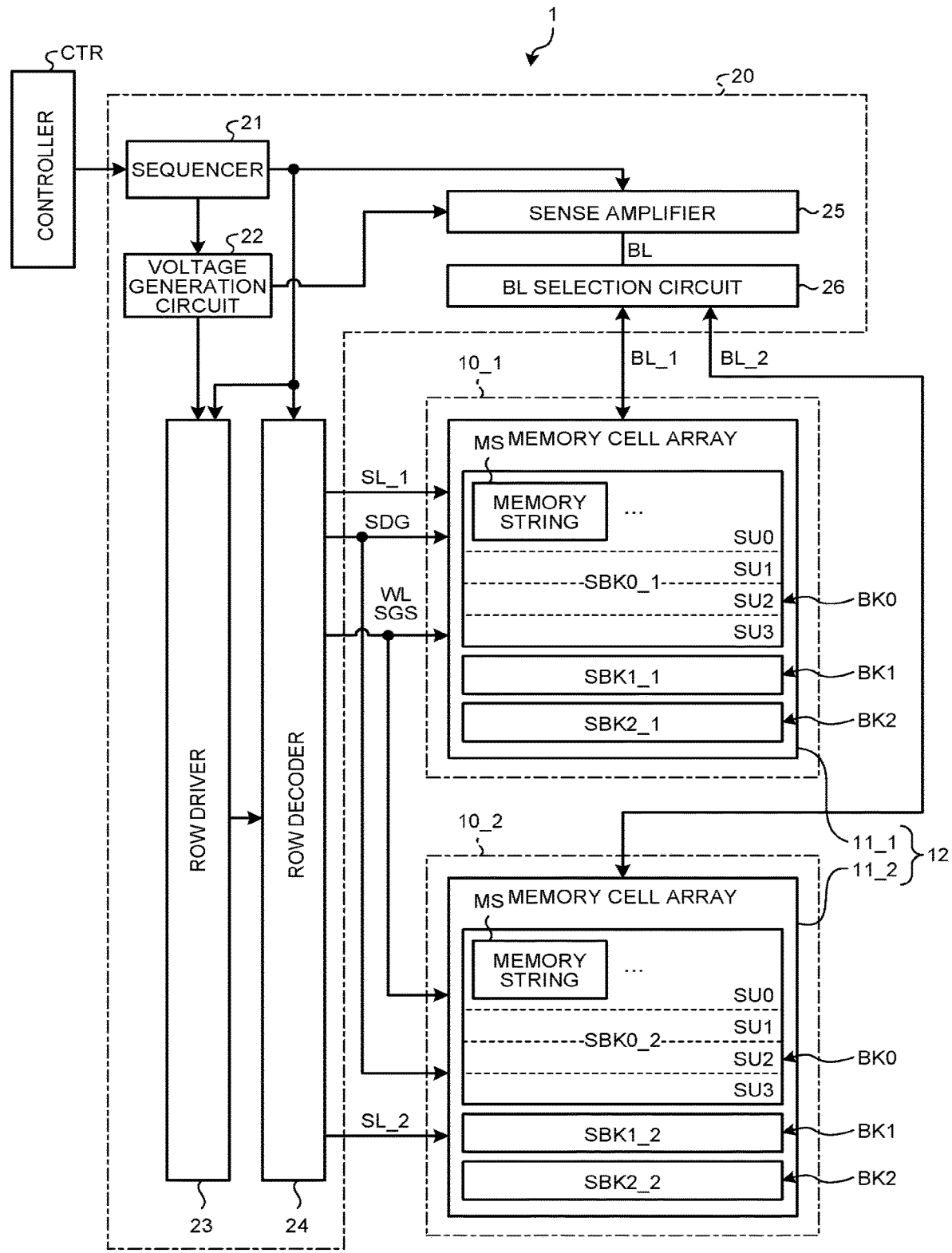
FIG. 1 is a block diagram illustrating a configuration of a semiconductor memory device according to an embodiment.

The semiconductor memory device according to the embodiment includes a memory cell array, and data may be erased with respect to the memory cell array, but a device configured to make an erasing process multifunctional is provided. For example, a semiconductor memory device 1 is configured as illustrated in FIG. 1. FIG. 1 is a block diagram illustrating a configuration of the semiconductor memory device 1.

The semiconductor memory device 1 includes plural chips 10_1, 10_2, and 20. Among the plural chips 10_1 and 10_2, and 20, the chips 10_1 and 10_2 include memory cell arrays 11_1 and 11_2, respectively, and are also referred to as array chips. The chip 20 includes a circuit configured to control the memory cell arrays 11_1 and 11_2, and is also referred to as a circuit chip.

Note that the chips 10_1 and 10_2 are simply referred to as a chip 10 in a case where the chips 10_1 and 10_2 are not distinguished from each other. The memory cell arrays 11_1 and 11_2 are simply referred to as a memory cell array 11 in a case where the memory cell arrays 11_1 and 11_2 are not distinguished from each other.

The chip 10_1 includes the memory cell array 11_1. In the memory cell array 11_1, plural memory cell transistors (hereinafter, simply memory cell) are three-dimensionally arranged. The chip 10_2 includes the memory cell array 11_2. In the memory cell array 11_2, plural memory cells are three-dimensionally arranged. A memory cell array group 12 including the memory cell array 11_1 and the memory cell array 11_2 includes plural blocks BK. The block BK is a set of plural memory cells to which a word line WL is commonly connected. The block BK is divided into the plural chips 10_1 and 10-2. A unit in which the block BK is divided for each chip is referred to as a sub-block SBK.

When the memory cell array group 12 includes plural blocks BK0 to BK2, the memory cell array 11_1 includes plural sub-blocks SBK0_1 to SBK2_1, and the memory cell array 11_2 includes plural sub-blocks SBK0_2 to SBK2_2. Plural memory cells in the sub-block SBK are associated with a row and a column.

Each sub-block SBK includes plural string units SU. The string unit SU is a set of plural memory strings MS sharing the word line WL. FIG. 1 illustrates a configuration in which the sub-block SBK includes four string units SU0 to SU3.

The string unit SU includes the plural memory strings MS. The memory string MS includes a set of plural memory cells connected in series.

Note that although FIG. 1 illustrates a configuration in which the semiconductor memory device 1 includes two chips (array chips) 10_1 and 10_2, the semiconductor memory device 1 may include three or more array chips. Accordingly, the memory cell array group 12 may include three or more memory cell arrays 11. The number of blocks BK in the memory cell array group 12 and the number of sub-blocks SBK in the memory cell array 11 are freely selected. The number of string units SU in the sub-block SBK is freely selected.

The chip 20 includes a sequencer 21, a voltage generation circuit 22, a row driver 23, a row decoder 24, and a sense amplifier 25 as circuits configured to control the memory cell arrays 11_1 and 11_2.

The sequencer 21 comprehensively controls each unit of the chip 20. The sequencer 21 is connected to the voltage generation circuit 22, the row driver 23, the row decoder 24, and the sense amplifier 25. The sequencer 21 controls the operation of the semiconductor memory device 1 based on command and data received from an external controller CTR.

For example, the sequencer 21 controls write operation based on a write command. In the control of the write operation, the sequencer 21 writes data from an addressed memory cell in the memory cell array 11 and returns a write completion notification to the controller CTR. The sequencer 21 controls read operation based on a read command. In the control of the read operation, the sequencer 21 reads data from an addressed memory cell in the memory cell array 11 and returns the read data to the controller CTR. The sequencer 21 controls erasing operation based on an erasing command. In the control of the erasing operation, the sequencer 21 erases data of an addressed region in the memory cell array 11 and returns an erasing completion notification to the controller CTR.

The voltage generation circuit 22 generates a voltage used for the write operation, the read operation, the erasing operation, and the like. The voltage generation circuit 22 is connected to the row driver 23 and the sense amplifier 25. The voltage generation circuit 22 supplies the generated voltage to the row driver 23 and/or the sense amplifier 25.

The row driver 23 is connected to the row decoder 24. The row driver 23 receives a row address (for example, page address) from the sequencer 21. The row driver 23 transfers the voltage received from the voltage generation circuit 22 to the row decoder 24 according to the row address.

The row decoder 24 receives a row address (for example, block address) from the sequencer 21. The row decoder 24 decodes the row address. The row decoder 24 selects the addressed block BK in the memory cell array 11 according to the decoding result.

The row decoder 24 is connected to the memory cell arrays 11_1 and 11_2 via plural word lines WL. The word line WL of the memory cell array 11_1 and the word line WL of the memory cell array 11_2 are commonly connected to the row decoder 24. As a result, the row decoder 24 can drive the word line WL of the memory cell array 11_1 and the word line WL of the memory cell array 11_2 in parallel.

The row decoder 24 is connected to the memory cell arrays 11_1 and 11_2 via plural select gate lines SGD and SGS. The select gate lines SGD and SGS of the memory cell array 11_1 and the select gate lines SGD and SGS of the memory cell array 11_2 are commonly connected to the row decoder 24. As a result, the row decoder 24 can drive the select gate lines SGD and SGS of the memory cell array 11_1 and the select gate lines SGD and SGS of the memory cell array 11_2 in parallel.

The row decoder 24 is connected to the memory cell array 11_1 via plural source lines SL_1, and is connected to the memory cell array 11_2 via plural source lines SL_2. The source line SL_1 of the memory cell array 11_1 and the source line SL_2 of the memory cell array 11_2 are respectively connected to the row decoder 24. As a result, the row decoder 24 can drive the source line SL_1 of the memory cell array 11_1 and the source line SL_2 of the memory cell array 11_2 independently of each other.

During the erasing operation, the row decoder 24 may supply an erasing voltage to one of the source line SL_1 and the source line SL_2 and may not supply the erasing voltage to the other source line. During the erasing operation, the row decoder 24 may supply the erasing voltage to the source line SL_1 and supply the erasing voltage to the source line SL_2 independently of each other.

A bit line BL_1 of the memory cell array 11_1 and a bit line BL_2 of the memory cell array 11_2 are individually connected to the sense amplifier 25. As a result, the sense amplifier 25 can drive or sense the bit line BL_1 of the memory cell array 11_1 and the bit line BL_2 of the memory cell array 11_2 independently of each other.

The sense amplifier 25 is connected to a BL selection circuit 26 via plural bit lines BL. The BL selection circuit 26 is connected to each of the memory cell arrays 11_1 and 11_2. The BL selection circuit 26 is connected to the memory cell array 11_1 via plural bit lines BL_1 and is connected to the memory cell array 11_2 via plural bit lines BL_2. The BL selection circuit 26 selects and connects at least one of the plural bit lines BL_1 and the plural bit lines BL_2 to the plural bit lines BL.

When the BL selection circuit 26 selects and connects the plural bit lines BL_1 to the plural bit lines BL, the sense amplifier 25 supplies a voltage corresponding to write data to the bit line BL_1 of the memory cell array 11_1 during the write operation. The sense amplifier 25 supplies a voltage to the bit line BL_1 of the memory cell array 11_1 to sense a potential during the read operation. The sense amplifier 25 may supply an erasing voltage to the bit line BL_1 during the erasing operation.

When the BL selection circuit 26 selects and connects the plural bit lines BL_2 to the plural bit lines BL, the sense amplifier 25 supplies a voltage corresponding to write data to the bit line BL_2 of the memory cell array 11_2 during the write operation. The sense amplifier 25 supplies a voltage to the bit line BL_2 of the memory cell array 11_2 to sense a potential during the read operation. The sense amplifier 25 may supply an erasing voltage to the bit line BL_2 during the erasing operation.

Figure 2:
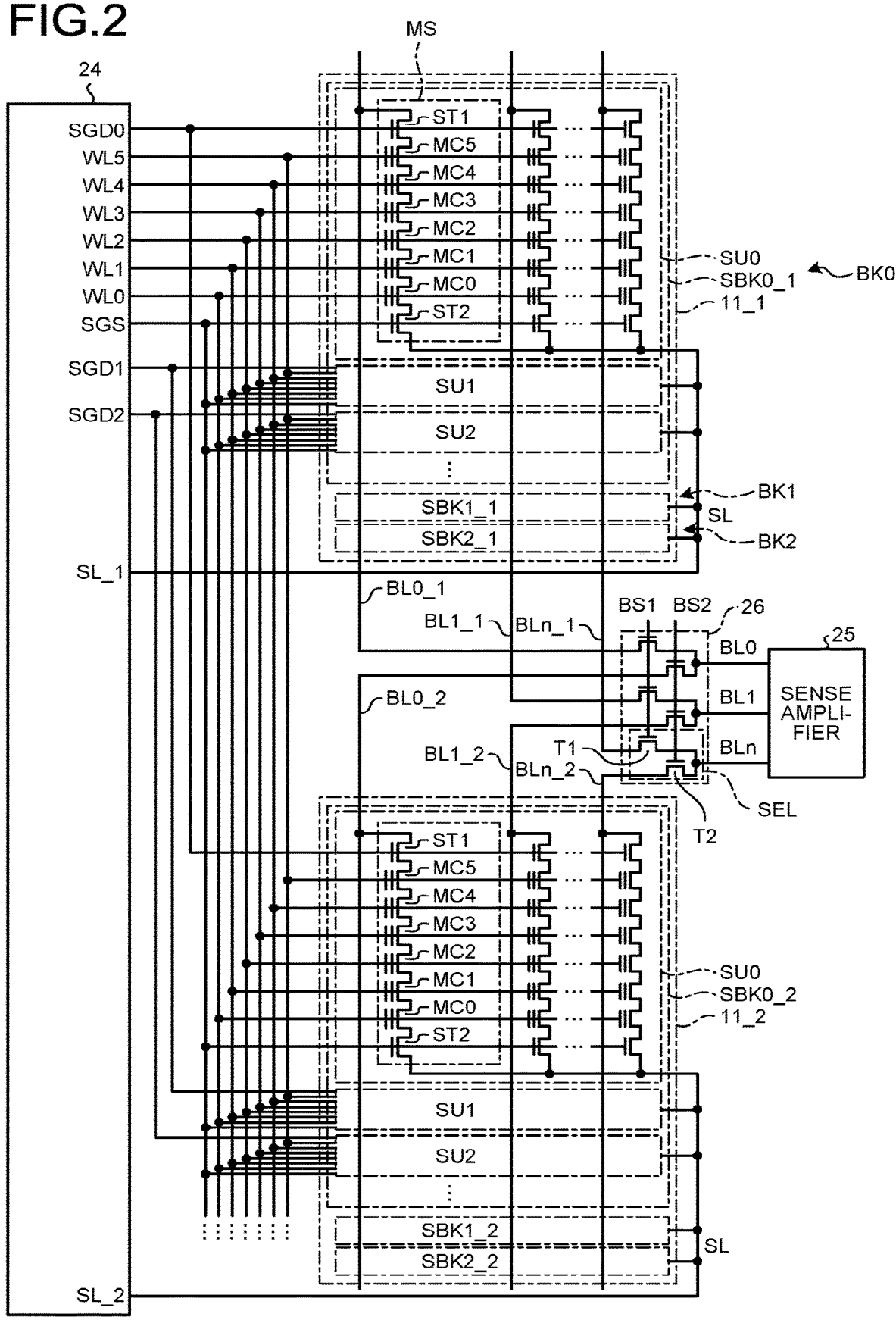
FIG. 2 is a circuit diagram illustrating a configuration of each memory cell array according to the embodiment.

Next, a circuit configuration of each of the memory cell arrays 11_1 and 11_2 will be described with reference to FIG. 2. FIG. 2 is a circuit diagram illustrating a configuration of each of the memory cell arrays 11_1 and 11_2.

Each string unit SU of each sub-block SBK of each memory cell array 11 has the plural memory strings MS. Each memory string MS includes plural memory cells MC and select transistors ST1 and ST2. In each memory string MS, plural memory cells MC0 to MC5 are connected in series between the select transistors ST1 and ST2. The drain of the select transistor ST1 is connected to the bit line BL. The source of the select transistor ST2 is connected to the source line SL.

In each string unit SU, the select gate lines SGD and SGS and the word line WL are commonly connected to the plural memory strings MS. For example, the select gate line SGD is commonly connected to the gates of the select transistors ST1 of the plural memory strings MS. The word line WL is commonly connected to the gates of the memory cells MC of the plural memory strings MS. The select gate line SGS is commonly connected to the gates of the select transistors ST2 of the plural memory strings MS.

In one string unit SU, a set of plural memory cells MC connected to one word line WL is referred to as a cell unit CU. For example, when the memory cell MC stores p-bit data (p is an integer of 1 or more), the storage capacity of the cell unit CU is defined as p-page data.

Each memory string MS of the memory cell array 11_1 and each memory string MS of the memory cell array 11_2 are configured such that the word lines WL can be driven in parallel. Each word line WL is commonly connected to the gate of the memory cell MC of the memory cell array 11_1 and the gate of the memory cell MC of the memory cell array 11_2. The word line WL0 is commonly connected to the gate of the memory cell MC0 of the memory cell array 11_1 and the gate of the memory cell MC0 of the memory cell array 11_2. The word line WL5 is commonly connected to the gate of the memory cell MC5 of the memory cell array 11_1 and the gate of the memory cell MC5 of the memory cell array 11_2.

Each memory string MS of the memory cell array 11_1 and each memory string MS of the memory cell array 11_2 are configured such that the select gate lines SGD can be driven in parallel. The select gate line SGD0 is commonly connected to the gate of the select transistor ST2 of the string unit SU0 of the memory cell array 11_1 and the gate of the select transistor ST2 of the string unit SU0 of the memory cell array 11_2. The select gate line SGD2 is commonly connected to the gate of the select transistor ST2 of the string unit SU2 of the memory cell array 11_1 and the gate of the select transistor ST2 of the string unit SU2 of the memory cell array 11_2.

Each memory string MS of the memory cell array 11_1 and each memory string MS of the memory cell array 11_2 are configured such that the select gate lines SGS can be driven in parallel. The select gate line SGS is commonly connected to the gate of the select transistor ST2 of the memory cell array 11_1 and the gate of the select transistor ST2 of the memory cell array 11_2.

That is, the row decoder 24 can drive the word lines WL in parallel, can drive the select gate lines SGD in parallel, and can drive the select gate lines SGS in parallel, in the memory cell array 11_1 and the memory cell array 11_2. As a result, the circuit area of the portion of the row decoder 24 that drives the word line WL, the select gate line SGD, and the select gate line SGS can be suppressed compactly.

Each memory string MS of the memory cell array 11_1 and each memory string MS of the memory cell array 11_2 are configured such that the source lines SL can be driven independently of each other. The source lines SL are individually connected to the memory cell array 11_1 and the memory cell array 11_2. The source line SL_1 is connected to the source of the select transistor ST2 of each memory string MS in the memory cell array 11_1. The source line SL_2 is connected to the source of the select transistor ST2 of each memory string MS in the memory cell array 11_2.

Each memory string MS of the memory cell array 11_1 and each memory string MS of the memory cell array 11_2 are configured such that the bit lines BL can be driven independently of each other. The bit lines BL are individually connected to the memory cell array 11_1 and the memory cell array 11_2. The bit line BL_1 is connected to the drain of the select transistor ST2 of each memory string MS in the memory cell array 11_1. The bit line BL_2 is connected to the drain of the select transistor ST2 of each memory string MS in the memory cell array 11_2.

The BL selection circuit 26 is connected between the memory cell arrays 11_1 and 11-2 and the sense amplifier 25. The BL selection circuit 26 includes n selectors SEL. The n selectors SEL correspond to the n bit lines BL0 to BLn on the sense amplifier 25 side, correspond to the n bit lines BL0_1 to BLn_1 on the memory cell array 11_1 side, and correspond to the n bit lines BL0_2 to BLn_2 on the memory cell array 11_2 side. Each selector SEL connects the bit line BL on the sense amplifier 25 side to at least one of the bit line BL_1 on the memory cell array 11_1 side and the bit line BL_2 on the memory cell array 11_2 side according to bit line selection signals BS1 and BS2.

That is, the row decoder 24 can independently drive the source lines SL_1 and SL_2 in the memory cell array 11_1 and the memory cell array 11_2, and can select and drive at least one of the memory cell array 11_1 and the memory cell array 11_2. The sense amplifier 25 can independently drive the bit lines BL_1 and BL_2 in the memory cell array 11_1 and the memory cell array 11_2, and can select and drive at least one of the memory cell array 11_1 and the memory cell array 11_2. As a result, different erasing operations can be performed independently of each other in the memory cell array 11_1 and the memory cell array 11_2. That is, different functions regarding the erasing operation can be implemented in the memory cell array 11_1 and the memory cell array 11_2, and the memory cell array 11_1 and the memory cell array 11_2 can be selectively used depending on the application.

For example, in the erasing operation, if the memory cell array 11_1 is selected and the memory cell array 11_2 is not selected by the row decoder 24 and the BL selection circuit 26, data can be selectively erased in the addressed sub-block SBK in the memory cell array 11_1. At this time, data is not erased in the memory cell array 11_2. That is, the unit of erasing can be reduced to the size of the sub-block SBK in which the inside of the block BK is divided into units of chips. Note that both select both the memory cell array 11_1 and the memory cell array 11_2 can also be selected by the row decoder 24 and the BL selection circuit 26 to erase data.

Alternatively, a wiring load of the source line SL_1 of the memory cell array 11_1 may be different from a wiring load of the source line SL_2 of the memory cell array 11_2. A wiring load may vary depending on a parasitic capacitance, a parasitic resistance, and the like of the wiring. In the erasing operation, an erasing time of data in the memory cell array 11_1 and an erasing time of data in the memory cell array 11_2 can be made different in the row decoder 24, the BL selection circuit 26, and the sense amplifier 25 according to a difference in the wiring load. In a case where the wiring load of the source line SL_1 of the memory cell array 11_1 is higher than the wiring load of the source line SL_2 of the memory cell array 11_2, in the erasing operation, the erasing time of data in the memory cell array 11_1 can be controlled to be longer than the erasing time of data in the memory cell array 11_2.

Alternatively, in the erasing operation, an erasing voltage of data in the memory cell array 11_1 and an erasing voltage of data in the memory cell array 11_2 can be made different in the row decoder 24, the BL selection circuit 26, and the sense amplifier 25 according to a difference in the wiring load. In a case where the wiring load of the source line SL_1 of the memory cell array 11_1 is higher than the wiring load of the source line SL_2 of the memory cell array 11_2, in the erasing operation, the erasing voltage of the data in the memory cell array 11_1 can be controlled to be higher than the erasing voltage of the data in the memory cell array 11_2.

Figure 3:
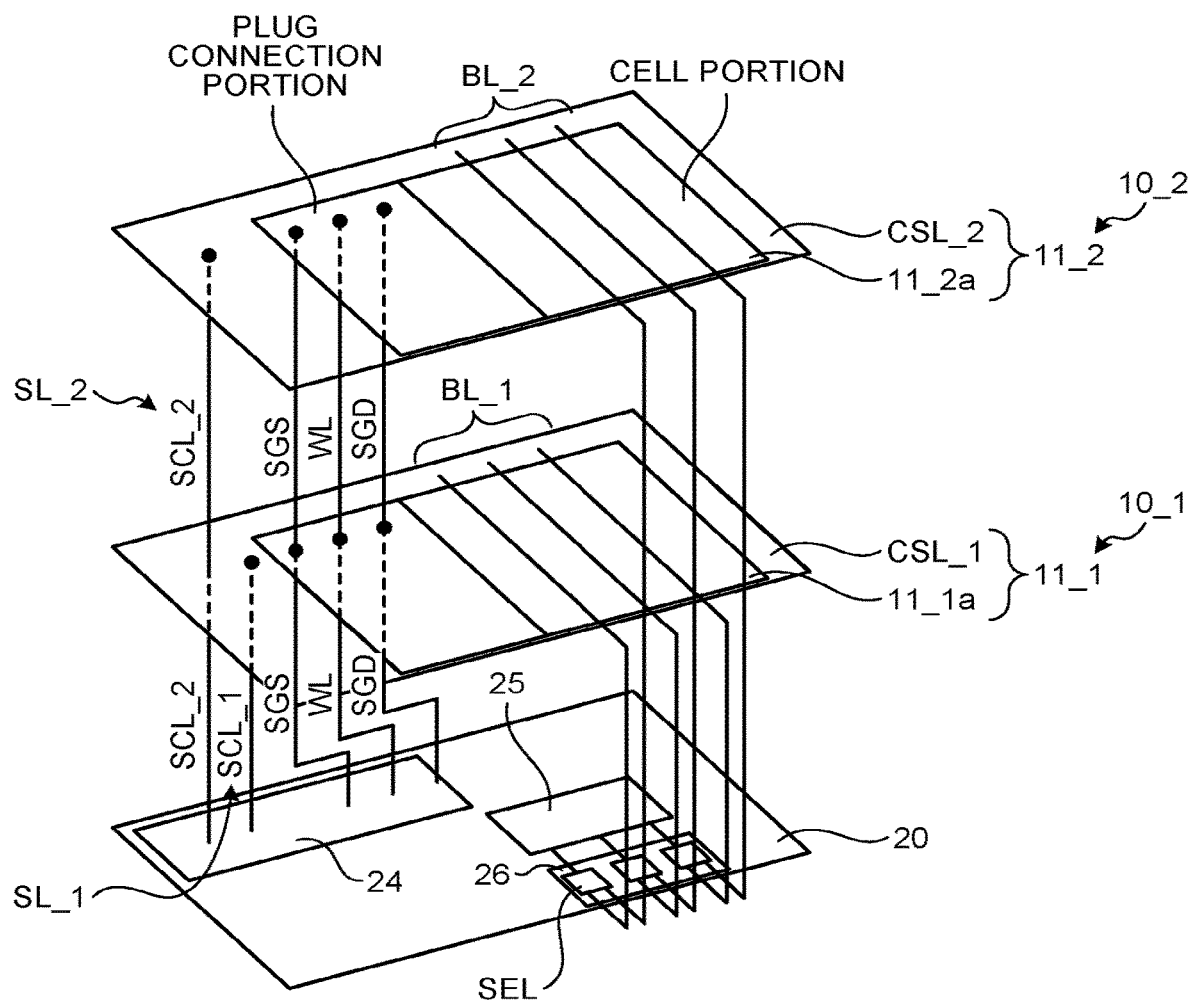
FIG. 3 is a diagram illustrating a connection configuration between chips according to the embodiment.

Next, a connection configuration between chips will be described with reference to FIG. 3. FIG. 3 is a diagram illustrating a connection configuration between the chips 20, 10_1, and 10_2.

The chip (array chip) 10_1 is disposed above the chip (circuit chip) 20. The chip 10_1 may be bonded to the upper surface of the chip 20. The chip (array chip) 10_2 is disposed above the chip 10_1. The chip 10_2 may be bonded to the upper surface of the chip 10_1. The chip 10_2 is bonded to the chip 10_1 on the opposite side of the chip 20. That is, a structure in which the chip 10_1 and the chip 10_2 are sequentially stacked on the chip 20 is formed. This structure is a structure in which plural memory cell arrays 11_1 and 11_2 are stacked, and is also referred to as a multi-stack array.

In each of the chips 10_1 and 10_2, the memory cell arrays 11_1 and 11_2 include a cell portion, a plug connection portion, and cell source portions CSL_1 and CSL_2. The cell portion is a region in which the plural memory cells MC are arranged. The plug connection portion is a region where the select gate line SGS, the word line WL, and the select gate line SGD are drawn out in the planar direction with respect to the cell portion and are respectively connected to contact plugs. The cell source portions CSL_1 and CSL_2 are adjacent to the cell portion and the plug connection portion in the stack direction, and are connected to each of the source-side end portions of the memory strings MS (refer to FIG. 2). The cell source portions CSL_1 and CSL_2 equivalently function as a part of the source lines SL_1 and SL_2.

A source connection line SCL_1 of the chip 10_1 and a source connection line SCL_2 of the chip 10_2 are individually connected to the row decoder 24 of the chip 20. The source connection line SCL_1 is connected to the cell source portion CSL_1 of the memory cell array 11_1. The source connection line SCL_1 and the cell source portion CSL_1 function as the source line SL_1. The source connection line SCL_2 passes through the cell source portion CSL_1 of the memory cell array 11_1 in a state of being insulated from the cell source portion CSL_1, and is connected to the cell source portion CSL_2 of the memory cell array 11_2. The source connection line SCL_2 and the cell source portion CSL_2 function as the source line SL_2. The source connection line SCL_1 and the source connection line SCL_2 are electrically insulated from each other. That is, the source line SL_1 and the source line SL_2 are electrically insulated from each other.

The word line WL of the chip 10_1 and the word line WL of the chip 10_2 are commonly connected to the row decoder 24 of the chip 20. The word line WL is connected to the plug connection portion of the memory cell array 11_1 and the plug connection portion of the memory cell array 11_2.

The select gate line SGD of the chip 10_1 and the select gate line SGD of the chip 10_2 are commonly connected to the row decoder 24 of the chip 20. The select gate line SGD is connected to the plug connection portion of the memory cell array 11_1 and the plug connection portion of the memory cell array 11_2.

The select gate line SGS of the chip 10_1 and the select gate line SGS of the chip 10_2 are commonly connected to the row decoder 24 of the chip 20. The select gate line SGS is connected to the plug connection portion of the memory cell array 11_1 and the plug connection portion of the memory cell array 11_2.

The bit line BL of the chip 10_1 and the bit line BL of the chip 10_2 are commonly connected to the sense amplifier 25 of the chip 20. The bit line BL is connected to the cell portion of the memory cell array 11_1 and the cell portion of the memory cell array 11_2.

Figure 4:
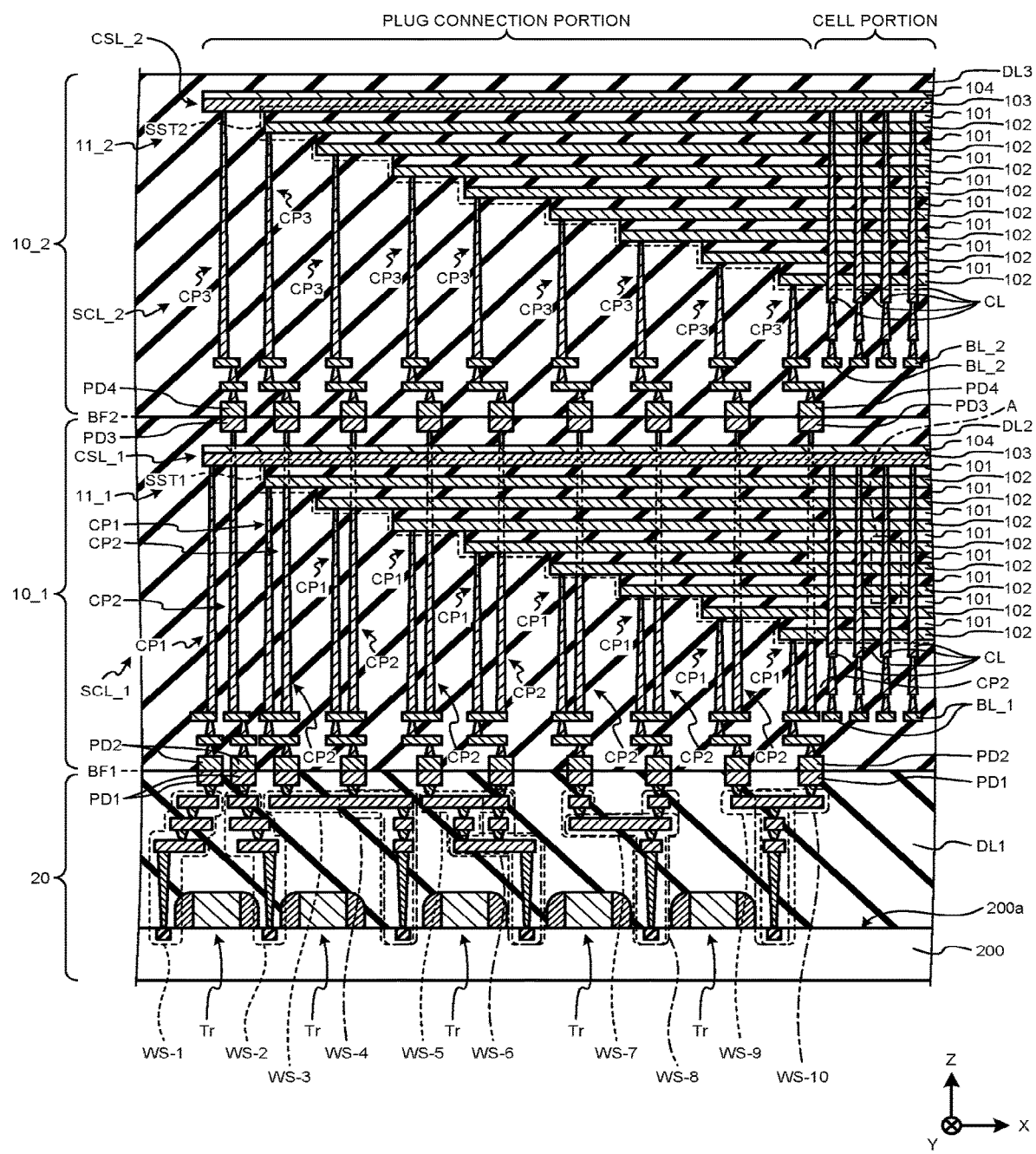
FIG. 4 is a cross-sectional view of the configuration of the semiconductor memory device according to the embodiment in a stack direction.

Next, a schematic configuration of each of the chips 20, 10_1, and 10_2 in the semiconductor memory device 1 will be described with reference to FIG. 4. FIG. 4 is a cross-sectional view of the configuration of the semiconductor memory device 1 in the stack direction.

In the semiconductor memory device 1, the plural chips 20, 10_1, and 10_2 are stacked. The chip 10_1 is disposed on the +Z side of the chip 20. The chip 10_2 is disposed on the +Z side of the chip 10_1. That is, the chips 10_1 and 10_2 are sequentially stacked on the +Z side of the chip 20. The structure in which the chips 10_1 and 10_2 are sequentially bonded to the +Z side of the chip 20 is referred to as the multi-stack array in which the memory cell arrays 11_1 and 11_2 are sequentially stacked.

Note that the number of chips (array chips) 10 stacked in the multi-stack array is not limited to two, and may be three or more.

The chip 10_1 is bonded to the +Z side surface of the chip 20. The chip 10_1 may be bonded by direct bonding. The chip 20 includes an insulating film (for example, oxide film) DL1 and an electrode PD1 on the +Z side thereof. The chip 10_1 has an insulating film (for example, oxide film) DL2 and an electrode PD2 on the −Z side thereof. On a bonding surface BF1 of the chips 20 and the insulating film DL1 of the chip 20 and the insulating film DL2 of the chip 10_1 are bonded, and the electrode PD1 of the chip 20 and the electrode PD2 of the chip 10_1 are bonded.

The chip 10_2 is bonded to the +Z side surface of the chip 10_1. The chip 10_2 is bonded to the chip 10_1 on the opposite side of the chip 20. The chip 10_2 may be bonded by direct bonding. The chip 10_1 has the insulating film (for example, oxide film) DL2 and an electrode PD3 on the +Z side thereof. The chip 10_2 has an insulating film (for example, oxide film) DL3 and an electrode PD4 on the −Z side thereof. On a bonding surface BF2 of the chips 10_1 and 10_2, the insulating film DL2 of the chip 10_1 and the insulating film DL3 of the chip 10_2 are bonded, and the electrode PD3 of the chip 10_1 and the electrode PD4 of the chip 10_2 are bonded.

The chip 20 includes a substrate 4, a transistor Tr, the electrode PD1, wiring structures WS-1 to WS-10, and the insulating film DL1. The substrate 4 is disposed on the −Z side of the chip 20 and extends in a plate shape in an XY direction. The substrate 4 can be formed of a material containing a semiconductor (for example, silicon) as a main component. The substrate 4 has a front surface 4a on the +Z side thereof. The transistor Tr functions as a circuit element of a circuit (sequencer 21, voltage generation circuit 22, row driver 23, row decoder 24, sense amplifier 25, and the like) configured to control the memory cell array 11. The transistor Tr includes a gate electrode disposed as a conductive film on the front surface 4a of the substrate 4, a source electrode and a drain electrode disposed as a semiconductor region in the vicinity of the front surface 4a in the substrate 4, and the like. As mentioned before, the electrode PD1 is disposed such that the surface thereof is exposed to the bonding surface BF1 of the chips 20 and 10_1. Each of the wiring structures WS-1 to WS-10 extends mainly in a Z direction and connects the gate electrode, the source electrode, the drain electrode, and the like of the transistor Tr to the electrode PD1.

The chip 10_1 includes a stacked body SST1, a conductive layer 103, a conductive layer 104, plural columnar bodies CL, plural plugs CP1, plural plugs CP2, plural conductive films BL_1, the electrode PD2, the electrode PD3, and the insulating film DL2. In the stacked body SST1, plural conductive layers 102 are stacked in the Z direction with an insulating layer 101 interposed therebetween. The plural conductive layers 102 function as the select gate line SGD, the word line WL5, the word line WL4, the word line WL3, the word line WL2, the word line WL1, the word line WL0, and the select gate line SGS in order from the −Z side to the +Z side.

Each of the conductive layers 102 extends in a plate shape in the XY direction. Each columnar body CL extends in the Z direction through the plural conductive layers 102. Each columnar body CL may penetrate the stacked body SST1 in the Z direction. Each columnar body CL extends in a columnar shape in the Z direction. Each columnar body CL includes a semiconductor film CH (refer to FIG. 5A) functioning as a channel region. The semiconductor film CH extends in a columnar shape (for example, in pillar shape or tubular shape) having an axis in the Z direction. The plural memory cells MC are formed at plural intersection positions where the plural conductive layers 102 and the plural columnar bodies CL intersect each other, that is, plural intersection positions where the plural conductive layers 102 and the plural semiconductor films CH intersect each other.

Figure 5A:
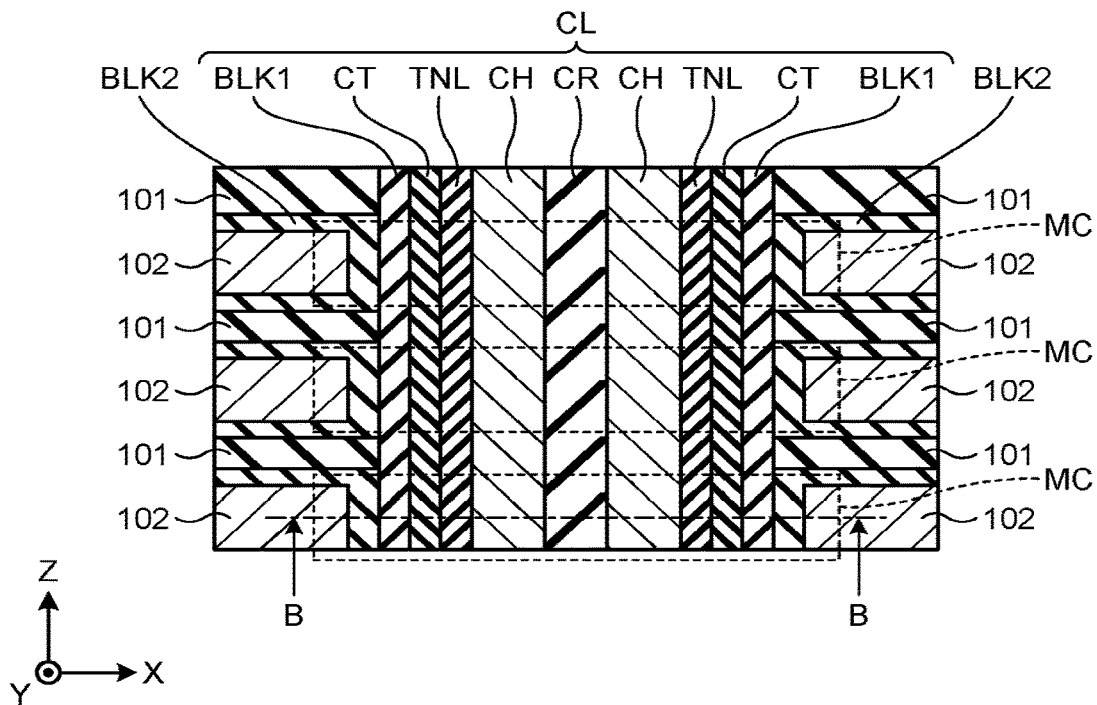
FIGS. 5A and 5B are cross-sectional views illustrating a configuration of a memory cell according to the embodiment in the stack direction and a planar direction.
Figure 5B:
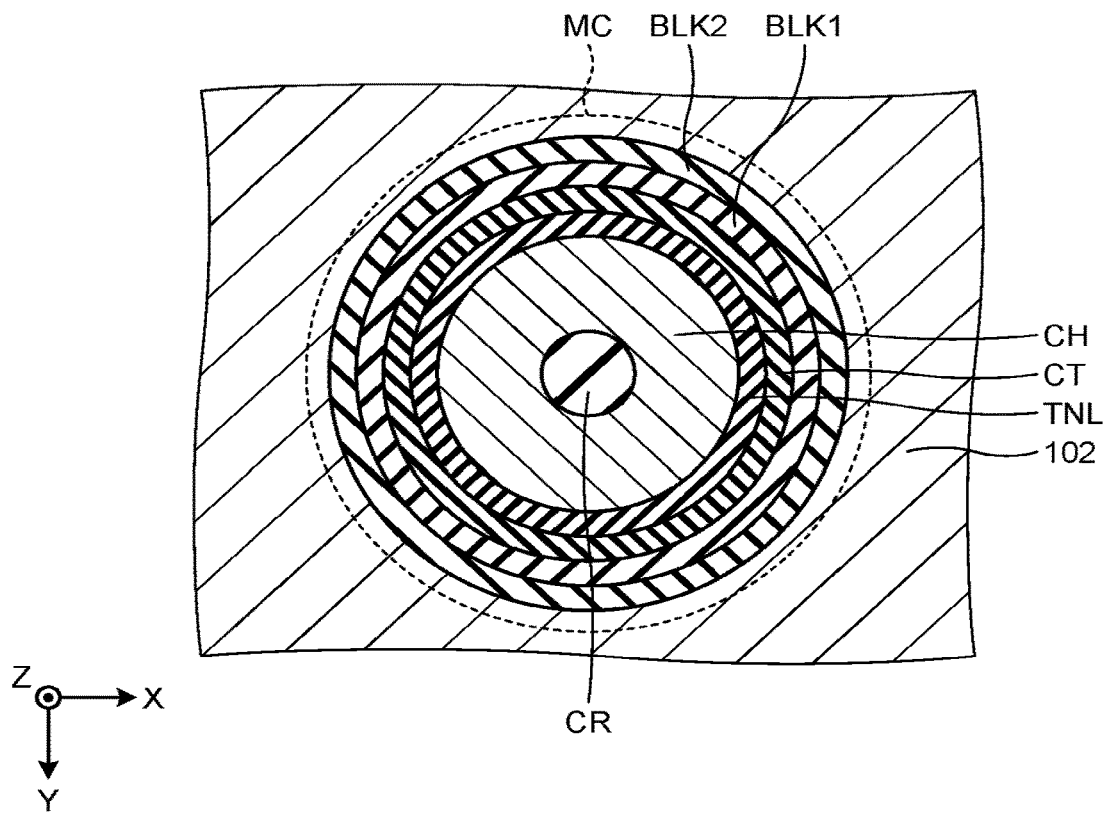

As illustrated in FIGS. 5A and 5B, each columnar body CL includes an insulating film CR, the semiconductor film CH, an insulating film TNL, a charge storage film CT, and an insulating film BLK1. FIG. 5A is an XZ cross-sectional view illustrating a configuration of the memory cell MC, and is an enlarged cross-sectional view of a portion A in FIG. 4. FIG. 5B is an XY cross-sectional view illustrating the configuration of the memory cell MC, and illustrates a cross section of FIG. 5A taken along line B-B. The insulating film CR extends in the Z direction and forms a pillar shape having an axis in the Z direction. The insulating film CR can be formed of an insulator such as silicon oxide. The semiconductor film CH extends in the Z direction so as to cover the insulating film CR from the outside in the XY direction, and has a tubular shape having an axis in the Z direction. The semiconductor film CH can be formed of a semiconductor such as polysilicon. The insulating film TNL extends in the Z direction so as to cover the semiconductor film CH from the outside in the XY direction, and has a tubular shape having an axis in the Z direction. The insulating film TNL can be formed of an insulator such as silicon oxide. The charge storage film CT extends in the Z direction so as to cover the insulating film TNL from the outside in the XY direction, and has a tubular shape having an axis in the Z direction. The charge storage film CT can be formed of an insulator such as silicon nitride. The insulating film BLK1 extends in the Z direction so as to cover the charge storage film CT from the outside in the XY direction, and has a tubular shape having an axis in the Z direction. The insulating film BLK1 can be formed of an insulator such as silicon oxide. An insulating film BLK2 covers the insulating film BLK1 from the outside in the XY direction, extends so as to cover a +Z side surface, a columnar body CL side surface, and a −Z side surface of the conductive layer 102, and forms a substantially hollow disk shape having an axis in the Z direction. The insulating film BLK2 can be formed of an insulator such as aluminum oxide. A portion surrounded by a dotted line in FIGS. 5A and 5B functions as the memory cell MC.

As illustrated in FIG. 4, a tip of the semiconductor film CH in the columnar body CL reaches the conductive layer 103. The semiconductor film CH is connected to the conductive layer 103 at a +Z side end thereof, and is connected to the conductive film BL_1 with a plug at a −Z side end thereof interposed therebetween. The conductive film BL_1 functions as the bit line BL_1 (refer to FIG. 2). The +Z side of the conductive layer 103 is covered with the conductive layer 104. The conductive layers 103 and 104 function as the cell source portion CSL_1 (refer to FIG. 3) in the source line SL. The semiconductor film CH functions as a channel region in the memory string MS (refer to FIG. 2).

Further, the respective conductive layers 102 may have substantially equal widths in a Y direction. Widths of the plural conductive layers 102 in an X direction gradually increase from the −Z side to the +Z side. The plural conductive layers 102 are configured such that ends in the X direction are positioned gradually outward from the −Z side to the +Z side. As a result, a staircase structure is formed in which the select gate line SGD, the word line WL5, the word line WL4, the word line WL3, the word line WL2, the word line WL1, the word line WL0, and the select gate line SGS are drawn out in a staircase shape in order from the −Z side to the +Z side at the plug connection portion in the memory cell array 11_1.

Furthermore, the conductive layer 103 may have a width in the X direction larger than that of the conductive layer 102 closest to the +Z side, and may have an end in the X direction positioned further outside. As a result, a staircase structure is formed in which the select gate line SGD, the word line WL5, the word line WL4, the word line WL3, the word line WL2, the word line WL1, the word line WL0, the select gate line SGS, and the cell source portion CSL_1 are drawn out in a staircase shape in order from the −Z side to the +Z side at the plug connection portion in the memory cell array 11_1.

The plural plugs CP1 correspond to the plural conductive layers 102 and 103. Each plug CP1 is disposed between the electrode PD1 and the corresponding conductive layers 102 and 103 in the Z direction, has the −Z side end thereof electrically connected to the electrode PD2, extends in the Z direction, and has the +Z side end thereof electrically connected to the corresponding conductive layers 102 and 103. As a result, the plug CP1 electrically connects the electrode PD2 to the corresponding conductive layers 102 and 103. The plug CP1 connecting the electrode PD2 to the conductive layer 103 functions as the source connection line SCL_1 (refer to FIG. 3) in the source line SL.

The plural plugs CP2 correspond to the plural electrodes PD2 and correspond to the plural electrodes PD3. Each plug CP2 is disposed between the corresponding electrode PD2 and the corresponding electrode PD3 in the Z direction, has the −Z side end thereof electrically connected to the electrode PD2, extends in the Z direction to penetrate plural conductive films 102, and has the +Z side end thereof electrically connected to the corresponding electrode PD3. Each plug CP2 penetrates the conductive film 102 in a state where the outer surface thereof is covered with the insulating film and insulated from the conductive film 102. As a result, the plug CP2 electrically connects the corresponding electrode PD2 to the corresponding electrode PD3. The plug CP2 connecting the electrode PD2, the corresponding electrode PD3, and the conductive layer 103 of the chip 10_2 functions as the source connection line SCL_2 (refer to FIG. 3) in the source line SL.

The plural conductive films BL_1 are disposed on the −Z side of the stacked body SST1. The plural conductive films BL_1 are arranged in the X direction. Each conductive film BL_1 extends in the Y direction. The plural conductive films BL_1 correspond to the plural columnar bodies CL. Each conductive film BL_1 is electrically connected to the −Z side end of the corresponding columnar body CL and functions as the bit line BL_1. The conductive film BL_1 is electrically connected to the electrode PD2. As a result, the bit line BL_1 can be connected to the transistor Tr of the chip 10 with the electrode PD2, the electrode PD1, and the wiring structure WS interposed therebetween.

As mentioned before, the electrode PD2 is disposed such that the surface thereof is exposed to the bonding surface BF1 of the chips 20 and 10_1. As mentioned before, the electrode PD3 is disposed such that the surface thereof is exposed to the bonding surface BF2 of the chips 10_1 and 10_2.

The chip 10_2 includes a stacked body SST2, the conductive layer 103, the conductive layer 104, the plural columnar bodies CL, plural plugs CP3, plural conductive films BL_2, the electrode PD4, and the insulating film DL2. In the stacked body SST2, plural conductive layers 102 are stacked in the Z direction with the insulating layer 101 interposed therebetween. The plural conductive layers 102 function as the select gate line SGD, the word line WL5, the word line WL4, the word line WL3, the word line WL2, the word line WL1, the word line WL0, and the select gate line SGS in order from the −Z side to the +Z side.

Each of the conductive layers 102 extends in a plate shape in the XY direction. Each columnar body CL extends in the Z direction through the plural conductive layers 102. Each columnar body CL may penetrate the stacked body SST2 in the Z direction. Each columnar body CL extends in a columnar shape in the Z direction. Each columnar body CL includes a semiconductor film CH (refer to FIG. 5) functioning as a channel region. The semiconductor film CH extends in a columnar shape (for example, in pillar shape or tubular shape) having an axis in the Z direction. The plural memory cells MC are formed at plural intersection positions where the plural conductive layers 102 and the plural columnar bodies CL intersect each other, that is, plural intersection positions where the plural conductive layers 102 and the plural semiconductor films CH intersect each other.

As illustrated in FIGS. 5A and 5B, each columnar body CL includes an insulating film CR, the semiconductor film CH, an insulating film TNL, a charge storage film CT, and an insulating film BLK1. The insulating film CR extends in the Z direction and forms a pillar shape having an axis in the Z direction. The insulating film CR can be formed of an insulator such as silicon oxide. The semiconductor film CH extends in the Z direction so as to cover the insulating film CR from the outside in the XY direction, and has a tubular shape having an axis in the Z direction. The semiconductor film CH can be formed of a semiconductor such as polysilicon. The insulating film TNL extends in the Z direction so as to cover the semiconductor film CH from the outside in the XY direction, and has a tubular shape having an axis in the Z direction. The insulating film TNL can be formed of an insulator such as silicon oxide. The charge storage film CT extends in the Z direction so as to cover the insulating film TNL from the outside in the XY direction, and has a tubular shape having an axis in the Z direction. The charge storage film CT can be formed of an insulator such as silicon nitride. The insulating film BLK1 extends in the Z direction so as to cover the charge storage film CT from the outside in the XY direction, and has a tubular shape having an axis in the Z direction. The insulating film BLK1 can be formed of an insulator such as silicon oxide. An insulating film BLK2 covers the insulating film BLK1 from the outside in the XY direction, extends so as to cover a +Z side surface, a columnar body CL side surface, and a −Z side surface of the conductive layer 102, and forms a substantially hollow disk shape having an axis in the Z direction. The insulating film BLK2 can be formed of an insulator such as aluminum oxide. A portion surrounded by a dotted line in FIGS. 5A and 5B functions as the memory cell MC.

As illustrated in FIG. 4, a tip of the semiconductor film CH in the columnar body CL reaches the conductive layer 103. The semiconductor film CH is connected to the conductive layer 103 at the +Z side end, and is connected to a conductive film BL_2 with a plug at the −Z side end thereof interposed therebetween. The conductive film BL_2 functions as the bit line BL_2 (refer to FIG. 2). The +Z side of the conductive layer 103 is covered with the conductive layer 104. The conductive layers 103 and 104 function as the cell source portion CSL_2 (refer to FIG. 3) in the source line SL. The semiconductor film CH functions as a channel region in the memory string MS (refer to FIG. 2).

Further, the respective conductive layers 102 may have substantially equal widths in a Y direction. Widths of the plural conductive layers 102 in an X direction gradually increase from the −Z side to the +Z side. The plural conductive layers 102 are configured such that ends in the X direction are positioned gradually outward from the −Z side to the +Z side. As a result, a staircase structure is formed in which the select gate line SGD, the word line WL5, the word line WL4, the word line WL3, the word line WL2, the word line WL1, the word line WL0, and the select gate line SGS are drawn out in a staircase shape in order from the −Z side to the +Z side at the plug connection portion in the memory cell array 11_2.

Furthermore, the conductive layer 103 may have a width in the X direction larger than that of the conductive layer 102 closest to the +Z side, and may have an end in the X direction positioned further outside. As a result, a staircase structure is formed in which the select gate line SGD, the word line WL5, the word line WL4, the word line WL3, the word line WL2, the word line WL1, the word line WL0, the select gate line SGS, and the cell source portion CSL_2 are drawn out in a staircase manner in order from the −Z side to the +Z side at the plug connection portion in the memory cell array 11_2.

The plural plugs CP3 correspond to the plural conductive layers 102 and 103. Each plug CP3 is disposed between the electrode PD4 and the corresponding conductive layers 102 and 103 in the Z direction, has the −Z side end thereof electrically connected to the electrode PD4, extends in the Z direction, and has the +Z side end thereof electrically connected to the corresponding conductive layer 102 and 103. As a result, the plug CP3 electrically connects the electrode PD4 to the corresponding conductive layers 102 and 103. The plug CP3 connecting the electrode PD4 to the conductive layer 103 functions as the source connection line SCL_2 (refer to FIG. 3) in the source line SL.

The plural conductive films BL_2 are disposed on the −Z side of the stacked body SST2. The plural conductive films BL_2 are arranged in the X direction. Each conductive film BL_2 extends in the Y direction. The plural conductive films BL_2 correspond to the plural columnar bodies CL. Each conductive film BL_2 is electrically connected to the −Z side end of the corresponding columnar body CL and functions as the bit line BL_2. The conductive film BL_2 is electrically connected to the electrode PD4. As a result, the bit line BL_2 can be connected to the transistor Tr of the chip 10 with the electrode PD4, the electrode PD1, and the wiring structure WS interposed therebetween.

As mentioned before, the electrode PD4 is disposed such that the surface thereof is exposed to the bonding surface BF2 of the chips 10_1 and 10_2.

Comparing the chip 10_1 with the chip 10_2, the source connection line SCL_1 extending from the cell source portion CSL_1 to the chip 20 and the source connection line SCL_2 extending from the cell source portion CSL_2 to the chip 20 are insulated from each other. A connection configuration from the conductive layer 103 that a tip of the semiconductor film CH of the chip 10_1 reaches to the transistor Tr of the chip 20 (plug CP1→electrode PD2→electrode PD1→wiring structure WS-1) and a connection configuration from the conductive layer 103 that a tip of the semiconductor film CH of the chip 10_2 reaches to the transistor Tr of the chip 20 (plug CP3→electrode PD4→electrode PD3→plug CP2→electrode PD2→electrode PD1→wiring structure WS-2) are insulated from each other.

In addition, the bit line BL_1 extending from a rear end of the semiconductor film CH of the chip 10_1 to the chip 20 and the bit line BL_2 extending from a rear end of the semiconductor film CH of the chip 10_2 to the chip 20 are insulated from each other. A connection configuration from the rear end of the semiconductor film CH of the chip 10_1 to the transistor Tr of the chip 20 (plug (not illustrated) →electrode PD2→electrode PD1→wiring structure WS) and a connection configuration from the rear end of the semiconductor film CH of the chip 10_2 to the transistor Tr of the chip 20 (plug (not illustrated)→electrode PD4→electrode PD3→plug (not illustrated)→electrode PD2→electrode PD1→wiring structure WS) are insulated from each other.

As a result, application of an erasing voltage to the memory cell MC through the driving of the source line SL_1 and the bit line BL_1 and application of an erasing voltage to the memory cell MC through the driving of the source line SL_2 and the bit line BL_2 can be performed independently of each other. That is, different erasing operations can be performed independently of each other in the memory cell array 11_1 and the memory cell array 11_2. Accordingly, different functions regarding the erasing operation can be implemented in the memory cell array 11_1 and the memory cell array 11_2, and the memory cell array 11_1 and the memory cell array 11_2 can be selectively used depending on the application.

For example, in the erasing operation, data can be erased in the memory cell array 11_1 and data can be prevented from being erased in the memory cell array 11_2. That is, both the memory cell arrays 11_1 and 11_2 are selected by supplying a selection voltage to the conductive layer 102 closest to the −Z side in the stacked body SST1 and the conductive layer 102 closest to the −Z side in the stacked body SST2. At this time, an erasing voltage (for example, about 20 V) is applied to a channel region of the memory cell MC of the memory cell array 11_1 via the source line SL_1 and the bit line BL_1, and a reference voltage (for example, about 0 V) is applied to a channel region of the memory cell MC of the memory cell array 11_2 via the source line SL_2 and the bit line BL_2. Accordingly, substantially, the memory cell array 11_1 is selected and the memory cell array 11_2 is not selected so that data can be selectively erased in the addressed sub-block SBK in the memory cell array 11_1. At this time, data is not erased in the memory cell array 11_2. That is, the unit of erasing can be reduced to the size of the sub-block SBK in which the inside of the block BK is divided into units of chips.

Alternatively, in the erasing operation, data is not erased in the memory cell array 11_1, and data can be erased in the memory cell array 11_2. That is, both the memory cell arrays 11_1 and 11_2 are selected by supplying a selection voltage to the conductive layer 102 closest to the −Z side in the stacked body SST1 and the conductive layer 102 closest to the −Z side in the stacked body SST2. At this time, a reference voltage (for example, about 0 V) is applied to the channel region of the memory cell MC of the memory cell array 11_1 with the source line SL_1 and the bit line BL_1 interposed therebetween, and an erasing voltage (for example, about 20 V) is applied to the channel region of the memory cell MC of the memory cell array 11_2 with the source line SL_2 and the bit line BL_2 interposed therebetween. Accordingly, substantially, the memory cell array 11_1 is not selected and the memory cell array 11_2 is selected so that data can be selectively erased in the addressed sub-block SBK in the memory cell array 11_2. At this time, data is not erased in the memory cell array 11_1. That is, the unit of erasing can be reduced to the size of the sub-block SBK in which the inside of the block BK is divided into units of chips.

In addition, the wiring load of the source line SL_1 of the memory cell array 11_1 and the wiring load of the source line SL_2 of the memory cell array 11_2 may be different. A wiring load may vary depending on a parasitic capacitance, a parasitic resistance, and the like of the wiring. Accordingly, in the erasing operation, the erasing time of data in the memory cell array 11_1 can be controlled to be different from the erasing time of data in the memory cell array 11_2. The erasing time is a time from when the semiconductor memory device 1 receives the erasing command to when the semiconductor memory device 1 returns the erasing completion notification.

For example, it is assumed that a parasitic capacitance of a connection configuration CST1 from the conductive layer 103 of the memory cell array 11_1 to the transistor Tr of the chip 20 is larger than a parasitic capacitance of a connection configuration CST2 from the conductive layer 103 of the memory cell array 11_2 to the transistor Tr of the chip 20. In this case, a wiring load of the connection configuration CST1 can be higher than a wiring load of the connection configuration CST2. Accordingly, in the erasing operation, the erasing time of data in the memory cell array 11_1 can be controlled to be longer than the erasing time of data in the memory cell array 11_2.

It is assumed that the conductive layer 104 of the memory cell array 11_1 is formed of a first conductor, and the conductive layer 104 of the memory cell array 11_2 is formed of a second conductor having a lower conductivity than that of the first conductor. The first conductor may be a material containing a metal such as copper as a main component, and the second conductor may be a material containing a metal having a lower conductivity such as aluminum as a main component. In this case, a total film thickness of the conductive layer 103 and the conductive layer 104 in the memory cell array 11_1 can be thinner than a total film thickness of the conductive layer 103 and the conductive layer 104 in the memory cell array 11_2, for example, by being flattened at the time of forming the memory cell array 11_1 and not flattened at the time of forming the memory cell array 11_2. As a result, a total parasitic resistance of the conductive layer 103 and the conductive layer 104 in the memory cell array 11_1 can be higher than a total parasitic resistance of the conductive layer 103 and the conductive layer 104 in the memory cell array 11_2. In this case, wiring loads of the conductive layer 103 and the conductive layer 104 in the memory cell array 11_1 can be higher than wiring loads of the conductive layer 103 and the conductive layer 104 in the memory cell array 11_2. Accordingly, in the erasing operation, the erasing time of data in the memory cell array 11_1 can be controlled to be longer than the erasing time of data in the memory cell array 11_2.

Alternatively, it is assumed that the parasitic capacitance of the connection configuration CST1 from the conductive layer 103 of the memory cell array 11_1 to the transistor Tr of the chip 20 is smaller than the parasitic capacitance of the connection configuration CST2 from the conductive layer 103 of the memory cell array 11_2 to the transistor Tr of the chip 20. In this case, the wiring load of the connection configuration CST1 can be lower than the wiring load of the connection configuration CST2. Accordingly, in the erasing operation, the erasing time of data in the memory cell array 11_1 can be controlled to be shorter than the erasing time of data in the memory cell array 11_2.

It is assumed that the conductive layer 104 of the memory cell array 11_1 is formed of a first conductor, and the conductive layer 104 of the memory cell array 11_2 is formed of a second conductor having a lower conductivity than that of the first conductor. The first conductor may be a material containing a metal such as copper as a main component, and the second conductor may be a material containing a metal having a lower conductivity such as aluminum as a main component. In this case, the total film thickness of the conductive layer 103 and the conductive layer 104 in the memory cell array 11_1 can be substantially equal to the total film thickness of the conductive layer 103 and the conductive layer 104 in the memory cell array 11_2. As a result, the total parasitic resistance of the conductive layer 103 and the conductive layer 104 in the memory cell array 11_1 can be lower than the total parasitic resistance of the conductive layer 103 and the conductive layer 104 in the memory cell array 11_2. In this case, the wiring loads of the conductive layer 103 and the conductive layer 104 in the memory cell array 11_1 can be lower than the wiring loads of the conductive layer 103 and the conductive layer 104 in the memory cell array 11_2. Accordingly, in the erasing operation, the erasing time of data in the memory cell array 11_1 can be controlled to be shorter than the erasing time of data in the memory cell array 11_2.

Furthermore, in addition to the erasing time or instead of the erasing time, the erasing voltage may be varied according to the difference in the wiring load. In the erasing operation, the erasing voltage of data in the memory cell array 11_1 may be controlled to be different from the erasing voltage of data in the memory cell array 11_2.

For example, it is assumed that a parasitic capacitance of a connection configuration CST1 from the conductive layer 103 of the memory cell array 11_1 to the transistor Tr of the chip 20 is larger than a parasitic capacitance of a connection configuration CST2 from the conductive layer 103 of the memory cell array 11_2 to the transistor Tr of the chip 20. In this case, a wiring load of the connection configuration CST1 can be higher than a wiring load of the connection configuration CST2. Accordingly, in the erasing operation, the erasing voltage of the data in the memory cell array 11_1 can be controlled to be higher than the erasing voltage of the data in the memory cell array 11_2.

It is assumed that the conductive layer 104 of the memory cell array 11_1 is formed of a first conductor, and the conductive layer 104 of the memory cell array 11_2 is formed of a second conductor having a lower conductivity than that of the first conductor. The first conductor may be a material containing a metal such as copper as a main component, and the second conductor may be a material containing a metal having a lower conductivity such as aluminum as a main component. In this case, a total film thickness of the conductive layer 103 and the conductive layer 104 in the memory cell array 11_1 can be thinner than a total film thickness of the conductive layer 103 and the conductive layer 104 in the memory cell array 11_2, for example, by being flattened at the time of forming the memory cell array 11_1 and not flattened at the time of forming the memory cell array 11_2. As a result, a total parasitic resistance of the conductive layer 103 and the conductive layer 104 in the memory cell array 11_1 can be higher than a total parasitic resistance of the conductive layer 103 and the conductive layer 104 in the memory cell array 11_2. In this case, wiring loads of the conductive layer 103 and the conductive layer 104 in the memory cell array 11_1 can be higher than wiring loads of the conductive layer 103 and the conductive layer 104 in the memory cell array 11_2. Accordingly, in the erasing operation, the erasing voltage of the data in the memory cell array 11_1 can be controlled to be higher than the erasing voltage of the data in the memory cell array 11_2.

Alternatively, it is assumed that the parasitic capacitance of the connection configuration CST1 from the conductive layer 103 of the memory cell array 11_1 to the transistor Tr of the chip 20 is smaller than the parasitic capacitance of the connection configuration CST2 from the conductive layer 103 of the memory cell array 11_2 to the transistor Tr of the chip 20. In this case, the wiring load of the connection configuration CST1 can be lower than the wiring load of the connection configuration CST2. Accordingly, in the erasing operation, the erasing voltage of the data in the memory cell array 11_1 can be controlled to be lower than the erasing voltage of the data in the memory cell array 11_2.

It is assumed that the conductive layer 104 of the memory cell array 11_1 is formed of a first conductor, and the conductive layer 104 of the memory cell array 11_2 is formed of a second conductor having a lower conductivity than that of the first conductor. The first conductor may be a material containing a metal such as copper as a main component, and the second conductor may be a material containing a metal having a lower conductivity such as aluminum as a main component. In this case, the total film thickness of the conductive layer 103 and the conductive layer 104 in the memory cell array 11_1 can be substantially equal to the total film thickness of the conductive layer 103 and the conductive layer 104 in the memory cell array 11_2. As a result, the total parasitic resistance of the conductive layer 103 and the conductive layer 104 in the memory cell array 11_1 can be lower than the total parasitic resistance of the conductive layer 103 and the conductive layer 104 in the memory cell array 11_2. In this case, the wiring loads of the conductive layer 103 and the conductive layer 104 in the memory cell array 11_1 can be lower than the wiring loads of the conductive layer 103 and the conductive layer 104 in the memory cell array 11_2. Accordingly, in the erasing operation, the erasing voltage of the data in the memory cell array 11_1 can be controlled to be lower than the erasing voltage of the data in the memory cell array 11_2.

Figure 6:
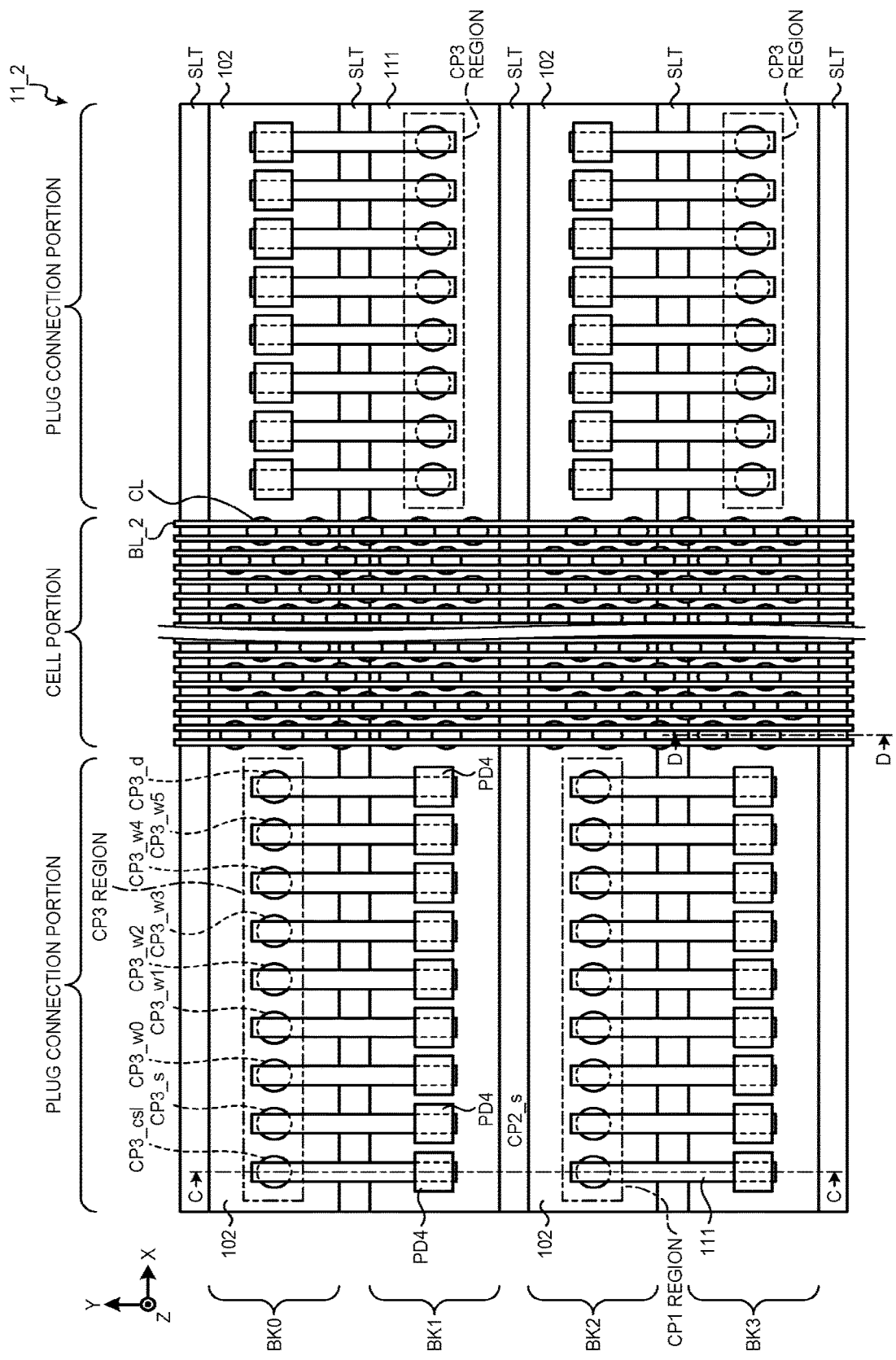
FIG. 6 is a plan view illustrating the configuration of the semiconductor memory device according to the embodiment.

Next, a planar configuration of the memory cell array 11_2 will be described with reference to FIG. 6. FIG. 6 is an XY plan view illustrating a configuration of the memory cell array 11_2.

In the memory cell array 11_2, blocks BK0, BK1, BK2, and BK3 are arranged in this order from the +Y side to the −Y side. In each block BK, plural conductive layers 102 are stacked apart from each other in the Z direction. For example, in each block BK, four conductive layers 102 functioning as the select gate line SGS, the word lines WL0 and WL1, and the select gate line SGD are stacked. A slit SLT extending in an XZ direction is disposed on the side surface in the Y direction of each block BK. The slit SLT electrically separates the plural blocks BK.

The block BK includes the cell portion and the plug connection portion.

The plural columnar bodies CL are disposed in the cell portion. Each columnar body CL extends in the Z direction. The columnar body CL corresponds to the memory string MS (refer to FIG. 2). The plural columnar bodies CL are two-dimensionally arranged in the XY direction. In the example of FIG. 6, the plural columnar bodies CL are arranged in four rows in the X direction. The number of rows in the arrangement of the columnar bodies CL may be three or less, or may be five or more. The plural columnar bodies CL may be arranged in a staggered manner or may be arranged in a lattice manner.

On the +Z side of the columnar body CL, the plural bit lines BL are arranged in the X direction and extend in the Y direction. The columnar body CL is connected to any one of the bit lines BL.

The plug connection portions are disposed on the opposite sides of the cell portion in the X direction. The plug connection portion includes a CP3 region.

In the CP3 region, the plural plugs CP3 are disposed. Each plug CP3 extends in the Z direction. The plug CP3 is electrically connected to one conductive layer 102 and is not electrically connected to the other conductive layer 102. Hereinafter, when the plug CP3 connected to the conductive layer 102 functioning as the word lines WL0 to WL5 is limited, the plug CP3 will be denoted as plugs CP3_$w$0 to CP3_$w$5. When the plug CP3 connected to the conductive layer 102 functioning as the select gate lines SGD and SGS is limited, the plug CP3 will be denoted as plugs CP3_$d$ and CP3_$s$. In the example of FIG. 6, the plugs CP3_$s$, CP3_$w$0, CP3_$w$1, CP3_$w$2, CP3_$w$3, CP3_$w$4, CP3_$w$5, and the plug CP3_$d$ are arranged in this order from the end portion in the X direction of the memory cell array 11_2 toward the cell portion. The plugs CP3 may be arranged in one row, or may be arranged in two rows in a staggered manner.

The conductive layer 111 is disposed on the −Z side of the plug CP3. The conductive layer 111 is electrically connected to the −Z side end of the plug CP3 and extends in a +Y direction or a −Y direction from a connection position with the plug CP3 to the adjacent block BK. For example, the conductive layer 111 extends in the −Y direction from the connection position with the plug CP3 in the block BK0 to a connection position with the electrode PD4 in the block BK1. In the adjacent block BK, the electrode PD4 is disposed at a position corresponding to the plug CP3 on the −Z side of the conductive layer 111, and the insulating layer 112 is disposed at other positions. A −Z side surface of the electrode PD4 is exposed to the bonding surface BF2. A −Z side surface of the insulating layer 112 is exposed to the bonding surface BF2.

Figure 7:
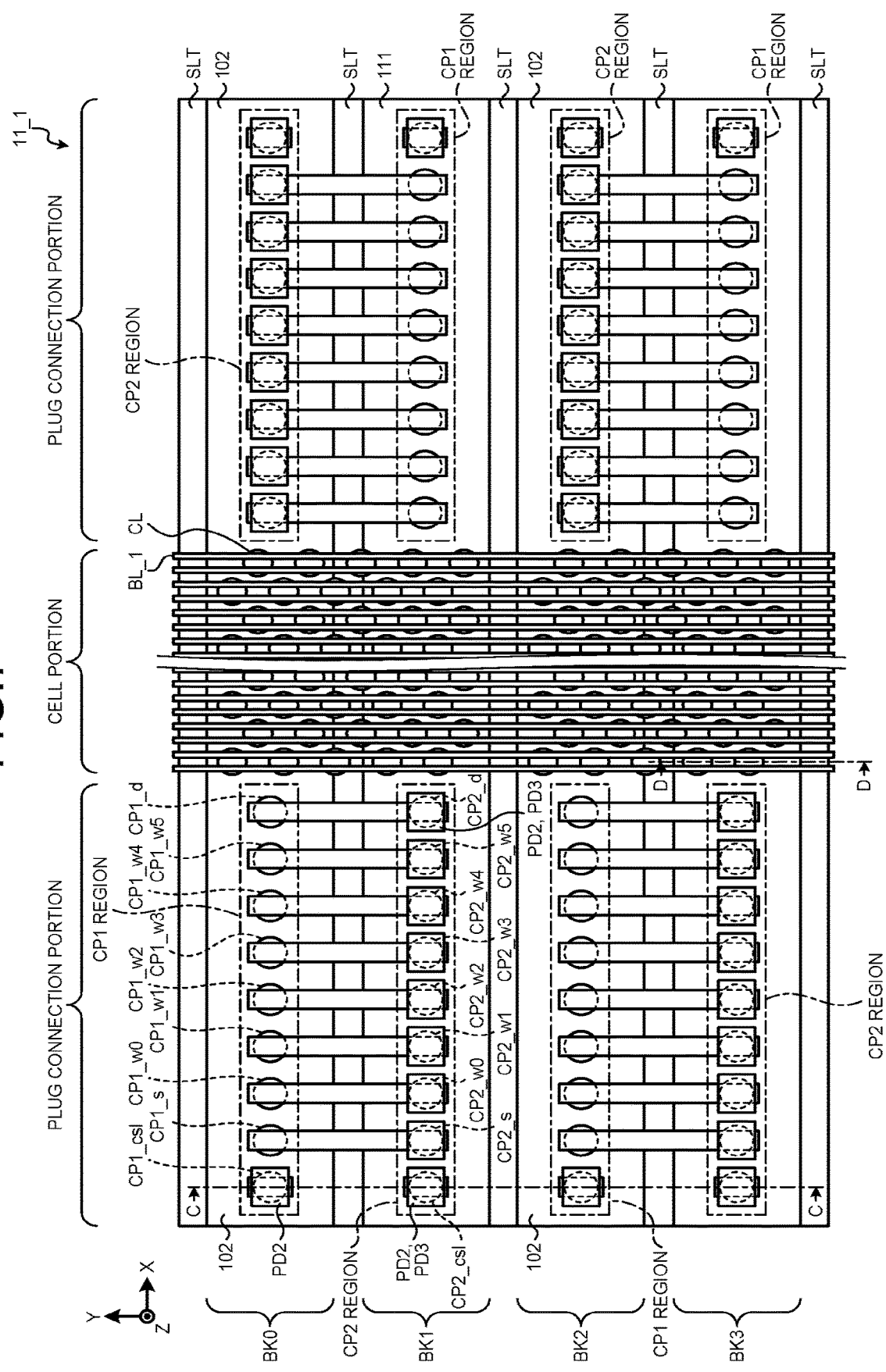
FIG. 7 is a plan view illustrating the configuration of the semiconductor memory device according to the embodiment.

Next, a planar configuration of the memory cell array 11_1 will be described with reference to FIG. 7. FIG. 7 is an XY plan view illustrating a configuration of the memory cell array 11_1.

The memory cell array 11_1 is similar to the memory cell array 11_2 in that each block BK includes the cell portion and the plug connection portion. A configuration of the cell portion of the memory cell array 11_1 is similar to that of the memory cell array 11_2.

The plug connection portions are disposed on the opposite sides of the cell portion in the X direction. The plug connection portion includes a CP1 region and a CP2 region.

In the CP1 region, the plural plugs CP1 are disposed. Each plug CP1 extends in the Z direction. The plug CP1 is electrically connected to one conductive layer 102 and is not electrically connected to the other conductive layer 102. The plug CP1 on an end portion side in the X direction is electrically connected to the conductive layer 103. Hereinafter, when the plug CP1 connected to the conductive layer 102 functioning as the word lines WL0 to WL5 is limited, the plug CP1 will be denoted as plugs CP1_$w$0 to CP1_$w$5. When the plug CP1 connected to the conductive layer 102 functioning as the select gate lines SGD and SGS is limited, the plug CP1 will be denoted as plugs CP1_$d$ and CP1_$s$. When the plug CP1 connected to the conductive layer 103 functioning as the cell source portion CSL is limited, the plug CP1 will be denoted as a plug CP1_cs1. In the example of FIG. 7, the plugs CP1_cs1, CP1_$s$, CP1_$w$0, CP1_$w$1, CP1_$w$2, CP1_$w$3, CP1_$w$4, CP1_$w$5, and the plug CP1_$d$ are arranged in this order from an end portion in the X direction of the memory cell array 11_1 toward the cell portion. The plugs CP1 may be arranged in one row, or may be arranged in two rows in a staggered manner.

The conductive layer 111 is disposed on the −Z side of the plug CP1_cs1. The conductive layer 111 is electrically connected to the −Z side end of the plug CP1 and is connected to the electrode PD2 at a connection position with the plug CP1. A −Z side surface of the electrode PD2 is exposed to the bonding surface BF1. The −Z side surface of the insulating layer 112 is exposed to the bonding surface BF1.

The conductive layer 111 is disposed on the −Z side of the plugs CP1_$s$ to CP1_$d$ other than the plug CP1_cs1. The conductive layer 111 is electrically connected to the −Z side end of the plug CP1 and extends in the +Y direction or the −Y direction from the connection position with the plug CP1 to the adjacent block BK. For example, the conductive layer 111 extends in the −Y direction from the connection position with the plug CP1 in the block BK0 to the connection position with the electrode PD4 in the block BK1. In the adjacent block BK, the electrode PD2 is disposed at a position corresponding to the plug CP2 on the −Z side of the conductive layer 111, and the insulating layer 112 is disposed at other positions. A −Z side surface of the electrode PD2 is exposed to the bonding surface BF1. The −Z side surface of the insulating layer 112 is exposed to the bonding surface BF1.

In the CP2 region, the plural plugs CP2 are disposed. Each plug CP2 extends in the Z direction. The plug CP2 is not electrically connected to the conductive layer 102 of the memory cell array 11_1. The plug CP2 on the end portion side in the X direction is not electrically connected to the conductive layer 103 of the memory cell array 11_1. The plug CP2 is electrically connected to one conductive layer 102 in the memory cell array 11_2 and is not electrically connected to the other conductive layer 102. The plug CP2 on the end portion side in the X direction is electrically connected to the conductive layer 103 of the memory cell array 11_2. Hereinafter, when the plug CP2 connected to the conductive layer 102 functioning as the word lines WL0 to WL5 is limited, the plug CP2 will be denoted as plugs CP2_w0 to CP2_w5. When the plug CP2 connected to the conductive layer 102 functioning as the select gate lines SGD and SGS is limited, the plug CP2 will be denoted as plugs CP2_d and CP2_s. When the plug CP2 connected to the conductive layer 103 functioning as the cell source portion CSL is limited, the plug CP2 will be denoted as a plug CP2_cs1. In the example of FIG. 7, the plugs CP2_cs1, CP2_s, CP2_w0, CP2_w1, CP2_w2, CP2_w3, CP2_w4, CP2_w5, and the plug CP2_d are arranged in this order from the end portion in the X direction of the memory cell array 11_1 toward the cell portion. The plugs CP2 may be arranged in one row, or may be arranged in two rows in a staggered manner.

The conductive layer 111 is disposed on the −Z side of the plug CP2_cs1. The conductive layer 111 is electrically connected to the −Z side end of the plug CP2 and is connected to the electrode PD2 at the connection position with the plug CP1. A −Z side surface of the electrode PD2 is exposed to the bonding surface BF1. The −Z side surface of the insulating layer 112 is exposed to the bonding surface BF1.

The conductive layer 111 is disposed on the −Z side of the plugs CP1_s to CP1_d other than the plug CP2_cs1. The conductive layer 111 is electrically connected to −Z side ends of the plugs CP2_s to CP2_d. The conductive layer 111 is connected to the electrode PD2 on the −Z side at the connection position with the plugs CP2_s to CP2_d. A −Z side surface of the electrode PD2 is exposed to the bonding surface BF1.

The conductive layer 111 extends in the +Y direction or the −Y direction from the connection position with the plugs CP1_s to CP1_d in the block BK to the connection position with the plugs CP2_s to CP2_d in the adjacent block BK.

For example, the conductive layer 111 extends in the −Y direction from the connection position with the plugs CP1_s to CP1_d in the block BK0 to the connection position with the plugs CP2_s to CP2_d in the block BK1. The plugs CP1_s to CP1_d and the plugs CP2_s to CP2_d correspond to each other. Each of the plugs CP1_s to CP1_d is electrically connected to the corresponding plug CP2 with the conductive layer 111 interposed therebetween.

Comparing the planar configuration of the memory cell array 11_1 illustrated in FIG. 7 with the planar configuration of the memory cell array 11_2 illustrated in FIG. 6, the number (for example, nine) of the plugs CP1 in the CP1 region is substantially equal to the number (for example, nine) of the plugs CP3 in the CP3 region. The number (for example, one) of the electrodes PD in the CP1 region is larger than the number (for example, zero) of the electrodes PD in the CP3 region. The number (for example, nine) of the plugs CP2 in the CP2 region is substantially equal to the number (for example, nine) of the plugs CP3 in the CP3 region. The number (for example, eighteen) of the electrodes PD in the CP2 region is larger than the number (for example, zero) of the electrodes PD in the CP3 region.

Figure 8:
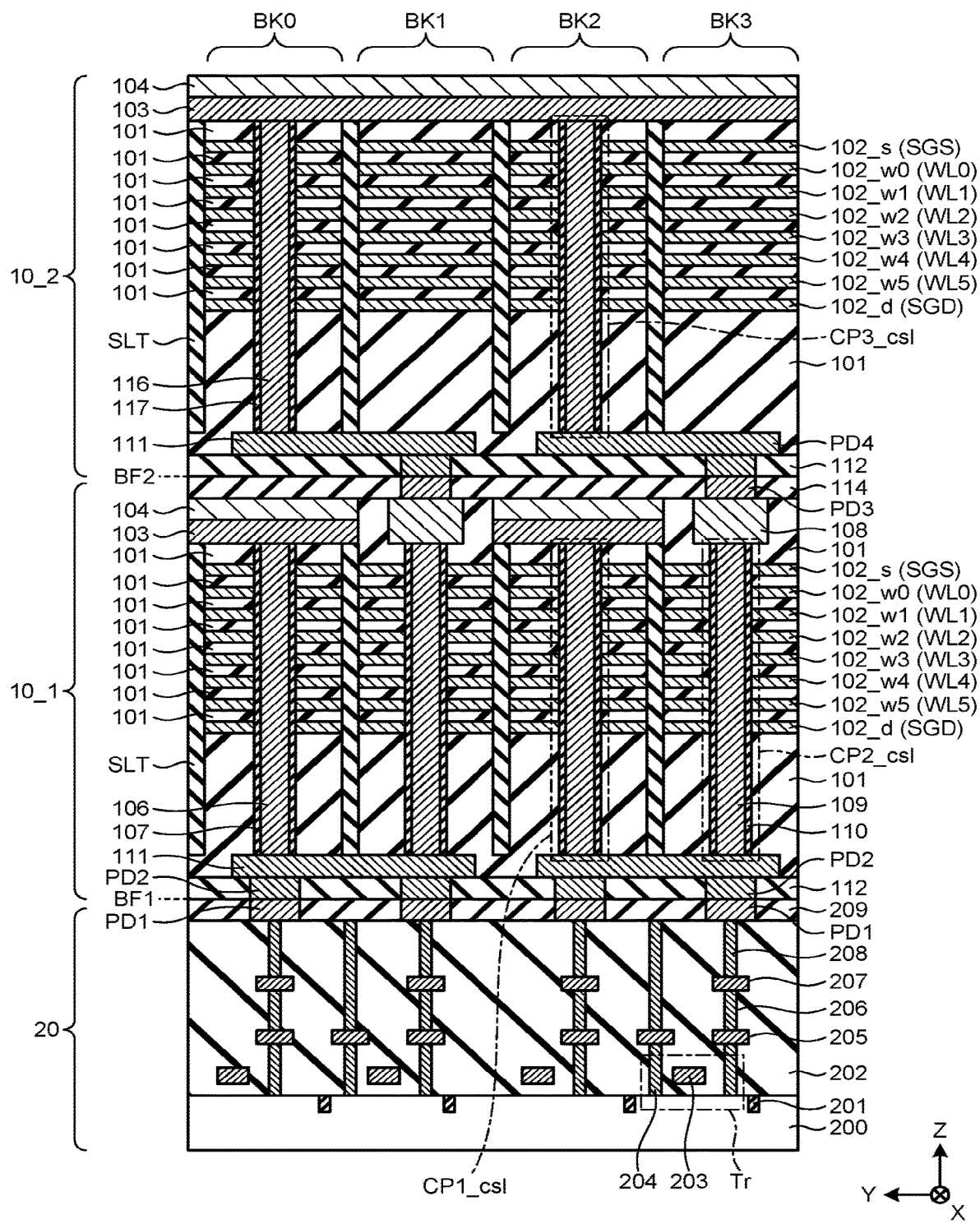
FIG. 8 is a cross-sectional view of a configuration of a plug connection portion according to the embodiment in the stack direction.

Next, a cross-sectional configuration of the plug connection portion will be described with reference to FIG. 8. FIG. 8 is a YZ cross-sectional view illustrating a configuration of the plug connection portion. FIG. 8 corresponds to the cross section of FIG. 6 and FIG. 7 taken along line C-C, respectively.

In the plug connection portion, the chips 20, and 10_2 are sequentially stacked and bonded. The chip 20 and the chip 10_1 are electrically connected to each other with the electrode PD1 and the electrode PD2 interposed therebetween. The chip 10_1 and the chip 10_2 are electrically connected to each other with the electrode PD3 and the electrode PD4 interposed therebetween.

The chip 10_1 includes the memory cell array 11_1 and the wiring thereof. The chip 10_1 includes the insulating layers 101, 107, 110, 112, and 114, the slit SLT, the conductive layers 102, 103, 104, and 111, conductors 106, 108, and 109, and the electrodes PD2 and PD3.

In the memory cell array 11_1, the insulating layer 101 and the conductive layer 102 are alternately stacked plural times. The plural conductive layers 102 function as the select gate line SGD, the word line WL5, the word line WL4, the word line WL3, the word line WL2, the word line WL1, the word line WL0, and the select gate line SGS in order from the −Z side to the +Z side.

In a case where the conductive layer 102 functioning as the word lines WL5, WL4, WL3, WL2, WL1, and WL0 is limited, the conductive layer 102 will be denoted as conductive layer 102_w5, 102_w4, 102_w3, 102_w2, 102_w1, and 102_w0. When the conductive layer 102 functioning as the select gate lines SGD and SGS is limited, the conductive layer 102 will be denoted as conductive layers 102_d and 102_s.

The insulating layer 101 can be formed of an insulator such as silicon oxide. The conductive layer 102 can be formed of a material containing a metal such as tungsten as a main component, or a conductor such as a semiconductor to which conductivity is imparted.

The plural conductive layers 102 are electrically separated from the conductive layers 102 of other blocks BK with the slits SLT extending in the XZ direction interposed therebetween. An insulator such as silicon oxide may be embedded in the slit SLT.

The conductive layer 103 is disposed on the +Z side of the conductive layer 102_s with the insulating layer 101 interposed therebetween. The conductive layer 104 is disposed on the +Z side of the conductive layer 103. The conductive layer 104 covers a +Z side surface of the conductive layer 103. The conductive layer 103 and the conductive layer 104 function as the cell source portion CSL in the source line SL. The +Z side of the conductive layer 104 is covered with the insulating layer 114. The +Z side surface of the insulating layer 114 is exposed to the bonding surface BF2.

The conductive layer 103 can be formed of a semiconductor (for example, polysilicon) to which conductivity is imparted. The conductive layer 104 can be formed of a conductor. The conductive layer 104 may be formed of the first conductor or the second conductor. The first conductor may be a material containing a metal such as copper as a main component, and the second conductor may be a material containing a metal having a lower conductivity such as aluminum as a main component.

The plug CP1 is disposed on the −Z side of the conductive layer 103. The plug CP1 has a pillar shape, for example, a cylindrical shape. The plug CP1 includes the conductor 106 and the insulating layer 107. The conductor 106 has a pillar shape, for example, a cylindrical shape. The insulating layer 107 covers the side surface of the conductor 106. The insulating layer 107 has a tubular shape, for example, a pipe shape.

In the plug CP1_cs1, the +Z side end of the conductor 106 is connected to the conductive layer 103. The conductor 106 penetrates plural conductive layers 102_s to 102_d in a state where the side surfaces thereof are electrically insulated from the plural conductive layers 102_s to 102_d with the insulating layer 107 interposed therebetween. The −Z side end of the conductor 106 is connected to the electrode PD2 with the conductive layer 111 interposed therebetween. As a result, the conductor 106 electrically connects the conductive layer 103 to the electrode PD2. The conductor 106 can be formed of a material containing a metal such as copper as a main component. The insulating layer 107 can be formed of an insulator such as silicon oxide.

In the plugs CP1_s to CP1_d other than the plug CP1_cs1, although not illustrated, the +Z side end of the conductor 106 is connected to a predetermined conductive layer 102. The conductor 106 penetrates the other conductive layer 102 in a state where the side surface thereof is electrically insulated from the other conductive layer 102 with the insulating layer 107 interposed therebetween. The −Z side end of the conductor 106 is connected to the electrode PD2 with the conductive layer 111 interposed therebetween. As a result, the conductor 106 electrically connects the predetermined conductive layer 102 to the electrode PD2.

On the −Z side of the conductive layer 111, the electrode PD2 is disposed at a connection position of the plug CP1_cs1, and the insulating layer 112 is disposed at the connection positions of the other plugs CP1_s to CP1_d. The −Z side surface of each of the electrode PD2 and the insulating layer 112 is exposed to the bonding surface BF1.

The plug CP2 extends through the plural conductive layers 102 in the Z direction. The plug CP2 has a pillar shape, for example, a cylindrical shape. The plug CP2 includes the conductor 109 and the insulating layer 110. The conductor 109 has a pillar shape, for example, a cylindrical shape. The insulating layer 110 covers the side surface of the conductor 109. The insulating layer 110 has a tubular shape, for example, a pipe shape.

In the CP2 region where the plug CP2 is disposed, the conductive layers 103 and 104 are not disposed on the +Z side of the plug CP2, and the conductor 108 is disposed. The +Z side end of the conductor 109 is connected to the electrode PD3 with the conductor 108 interposed therebetween. The conductor 109 penetrates the plural conductive layers 102 in a state where the side surface thereof is electrically insulated from the plural conductive layers 102 with the insulating layer 110 interposed therebetween. The −Z side end of the conductor 109 is connected to the electrode PD2 with the conductive layer 111 interposed therebetween. As a result, the conductor 109 electrically connects the electrode PD2 to the electrode PD3. The conductor 109 can be formed of a material containing a metal such as copper as a main component. The insulating layer 110 can be formed of an insulator such as silicon oxide.

The chip 10_2 includes the memory cell array 11_2 and the wiring thereof. The chip 10_2 includes the insulating layer 101, 112, and 117, the slit SLT, the conductive layer 102, 103, 104, and 111, a conductor 116, and the electrode PD4.

In the memory cell array 11_2, the insulating layer 101 and the conductive layer 102 are alternately stacked plural times. The plural conductive layers 102 function as the select gate line SGD, the word line WL5, the word line WL4, the word line WL3, the word line WL2, the word line WL1, the word line WL0, and the select gate line SGS in order from the −Z side to the +Z side.

In a case where the conductive layer 102 functioning as the word lines WL5, WL4, WL3, WL2, WL1, and WL0 is limited, the conductive layer 102 will be denoted as conductive layer $102\_w5$, $102\_w4$, $102\_w3$, $102\_w2$, $102\_w1$, and $102\_w0$. When the conductive layer 102 functioning as the select gate lines SGD and SGS is limited, the conductive layer 102 will be denoted as conductive layers $102\_d$ and $102\_s$.

The insulating layer 101 can be formed of an insulator such as silicon oxide. The conductive layer 102 can be formed of a material containing a metal such as tungsten as a main component, or a conductor such as a semiconductor to which conductivity is imparted.

The plural conductive layers 102 are electrically separated from the conductive layers 102 of other blocks BK with the slits SLT extending in the XZ direction interposed therebetween. An insulator such as silicon oxide may be embedded in the slit SLT.

The conductive layer 103 is disposed on the +Z side of the conductive layer $102\_s$ with the insulating layer 101 interposed therebetween. The conductive layer 104 is disposed on the +Z side of the conductive layer 103. The conductive layer 104 covers a +Z side surface of the conductive layer 103. The conductive layer 103 and the conductive layer 104 function as the source line SL.

The conductive layer 103 can be formed of a semiconductor (for example, polysilicon) to which conductivity is imparted. The conductive layer 104 can be formed of a material containing a metal such as aluminum as a main component.

The plug CP3 is disposed on the −Z side of the conductive layer 103. The plug CP3 has a pillar shape, for example, a cylindrical shape. The plug CP3 includes the conductor 116 and the insulating layer 117. The conductor 116 has a pillar shape, for example, a cylindrical shape. The insulating layer 117 covers the side surface of the conductor 116. The insulating layer 117 has a tubular shape, for example, a pipe shape.

In a plug CP3_cs1, the +Z side end of the conductor 116 is connected to the conductive layer 103. The conductor 116 penetrates the plural conductive layers $102\_s$ to $102\_d$ in a state where the side surfaces thereof are electrically insulated from the plural conductive layers $102\_s$ to $102\_d$ with the insulating layer 117 interposed therebetween. The −Z side end of the conductor 116 is connected to the electrode PD4 with the conductive layer 111 interposed therebetween. As a result, the conductor 116 electrically connects the conductive layer 103 to the electrode PD4. The conductor 116 can be formed of a material containing a metal such as copper as a main component. The insulating layer 117 can be formed of an insulator such as silicon oxide.

In the plugs CP1_s to CP1_d other than the plug CP1_cs1, although not illustrated, the +Z side end of the conductor 116 is connected to the predetermined conductive layer 102. The conductor 116 penetrates the other conductive layer 102 in a state where the side surface thereof is electrically insulated from the other conductive layer 102 with the insulating layer 117 interposed therebetween. The −Z side end of the conductor 116 is connected to the electrode PD4 with the conductive layer 111 interposed therebetween. As a result, the conductor 116 electrically connects the predetermined conductive layer 102 to the electrode PD4.

On the −Z side of the conductive layer 111, the insulating layer 112 is disposed at the connection position of the plug CP1_cs1, and the electrode PD4 is disposed at the position shifted from the connection position to the block BK adjacent in the Y direction. The −Z side surface of each of the electrode PD4 and the insulating layer 112 is exposed to the bonding surface BF2.

The chip 20 includes a substrate 200, insulating layers 201, 202, and 209, a gate electrode 203, a conductor 204, 206, 208, and 210, and a conductive layer 205 and 207.

A well region and an element isolation region are disposed in the vicinity of the surface of the substrate 200. The substrate 200 can be formed of a semiconductor (for example, silicon). The element isolation region electrically isolates the well region from other well regions. The insulating layer 201 is disposed in the element isolation region. The insulating layer 201 can be formed of an insulator such as silicon oxide.

The insulating layer 202 is disposed on the +Z side of the substrate 200. The insulating layer 202 can be formed of an insulator such as silicon oxide.

The transistor Tr includes the gate electrode 203 on a front surface 200a of the substrate 200, and a source electrode, a drain electrode, and the like in the vicinity of the front surface 200a in the substrate 200. The gate electrode 203 can be formed of a semiconductor (for example, polysilicon) to which conductivity is imparted. The source electrode and the drain electrode can be formed as a region containing impurities in the substrate 200.

The source electrode and the drain electrode are respectively connected to the conductive layer 205 with the conductor 204 interposed therebetween. The conductor 204 extends in the Z direction. The conductive layer 205 is connected to the conductive layer 207 with the conductor 206 interposed therebetween. The conductor 206 extends in the Z direction. The conductive layer 207 is connected to the electrode PD1 with the conductor 208 interposed therebetween. The conductor 208 extends in the Z direction. The conductor 204, 206, 208, and 210, and the conductive layer 205 and 207 can be made of a material containing a metal such as aluminum or copper as a main component.

On the +Z side of the insulating layer 202, the electrode PD1 is disposed at a position corresponding to the electrode PD2, and the insulating layer 209 is disposed at other positions. The electrode PD1 can be formed of a material containing a metal such as copper as a main component. The insulating layer 209 can be formed of an insulator such as silicon oxide.

Figure 9:
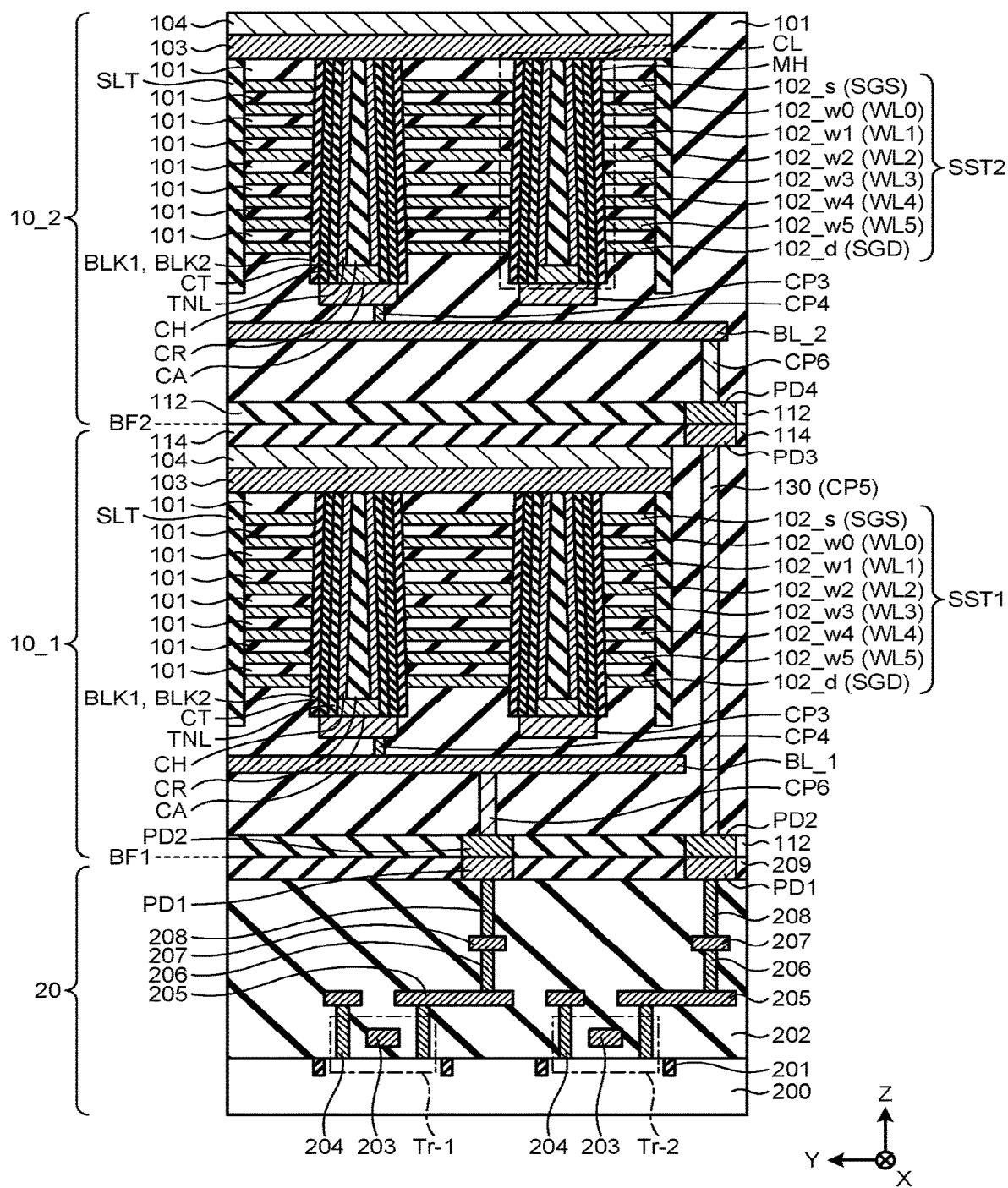
FIG. 9 is a cross-sectional view illustrating a configuration of a cell portion according to the embodiment in the stack direction.

Next, the cross-sectional configuration of the cell portion will be described with reference to FIG. 9. FIG. 9 is a YZ cross-sectional view illustrating the configuration of the cell portion. FIG. 9 corresponds to a cross section of each of FIGS. 6 and 7 taken along line D-D, respectively.

As illustrated in FIG. 9, the columnar body CL is disposed in each of the chips 10_1 and 10_2.

In the chip 10_2, the columnar body CL extends in the Z direction in the stacked body SST2 and penetrates the plural conductive layers 102. In the example of FIG. 9, the columnar body CL penetrates the eight conductive layers 102. The columnar body CL has the +Z side end thereof connected to the conductive layer 103 and the −Z side end thereof connected to the conductor CP3. A −Z side surface of the conductor CP3 is connected to the conductor CP4. The conductor CP4 extends in the Z direction, and has the −Z side end thereof connected to the conductive film BL_2.

The columnar body CL forms a pillar shape having an axis in the Z direction. In the columnar body CL, the insulating film CR, the semiconductor film CH, the insulating film TNL, the charge storage film CT, the insulating film BLK1, and the insulating film BLK2 are disposed in order from the axis to the outside as described above (refer to FIGS. 5A and 5B). The tip of the semiconductor film CH reaches the conductive layer 103. The semiconductor film CH covers the +Z side end of the insulating film CR at the +Z side end thereof and is in contact with the conductive layer 103. The rear end of the semiconductor film CH reaches the semiconductor layer CA. The semiconductor film CH is in contact with the semiconductor layer CA at the −Z side end thereof. The semiconductor layer CA can be formed of a semiconductor such as polysilicon. A −Z side surface of the semiconductor layer CA is in contact with the plug CP3. The −Z side end of the plug CP3 is in contact with the plug CP4. The −Z side end of the plug CP4 is in contact with the conductive film BL_2. The conductive layer 103 functions as the source line SL, and the conductive film BL_2 functions as the bit line BL_2. As a result, the +Z side end of the semiconductor film CH is electrically connected to the source line SL, the −Z side end is electrically connected to the bit line BL_2, and as such, the semiconductor film CH functions as the channel region in the memory string MS.

In the chip 10_2, plural memory cells MC arranged in the Z direction are formed at plural intersection positions where the plural conductive layers 102 and the columnar body CL intersect each other. The plural memory cells MC arranged in the Z direction correspond to the plural memory cells MC (refer to FIG. 2) included in the memory string MS. Plural memory cells MC arranged in an XYZ direction are formed at plural intersection positions where the plural conductive layers 102 and the plural columnar bodies CL2 intersect each other.

The conductive film BL_2 extends in the Y direction. The −Z side surface of the conductive film BL_2 is connected to the electrode PD4 with a plug CP6 interposed therebetween at a position shifted in the Y direction from the stacked body SST2. A −Z side surface of the electrode PD4 is exposed to the bonding surface BF2.

In the chip 10_1, the columnar body CL extends in the Z direction in the stacked body SST1 and penetrates the plural conductive layers 102. In the example of FIG. 9, the columnar body CL penetrates the eight conductive layers 102. The columnar body CL has the +Z side end thereof connected to the conductive layer 103 and the −Z side end thereof connected to the conductor CP3. A −Z side surface of the conductor CP3 is connected to the conductor CP4. The conductor CP4 extends in the Z direction, and has the −Z side end thereof connected to the conductive film BL_1.

The columnar body CL forms a pillar shape having an axis in the Z direction. In the columnar body CL, the insulating film CR, the semiconductor film CH, the insulating film TNL, the charge storage film CT, the insulating film BLK1, and the insulating film BLK2 are disposed in order from the axis to the outside as described above (refer to FIGS. 5A and 5B). The tip of the semiconductor film CH reaches the conductive layer 103. The semiconductor film CH covers the +Z side end of the insulating film CR at the +Z side end thereof and is in contact with the conductive layer 103. The rear end of the semiconductor film CH reaches the semiconductor layer CA. The semiconductor film CH is in contact with the semiconductor layer CA at the −Z side end thereof. The semiconductor layer CA can be formed of a semiconductor such as polysilicon. A −Z side surface of the semiconductor layer CA is in contact with the plug CP3. The −Z side end of the plug CP3 is in contact with the plug CP4. The −Z side end of the plug CP4 is in contact with the conductive film BL_1. The conductive layer 103 functions as a source line SL, and the conductive film BL1 functions as a bit line. As a result, the +Z side end of the semiconductor film CH is electrically connected to the source line SL, the −Z side end thereof is electrically connected to the bit line BL_1, thereby functioning as the channel region in the memory string MS.

In the chip 10_1, plural memory cells MC arranged in the Z direction are formed at plural intersection positions where the plural conductive layers 102 and the columnar bodies CL intersect each other. The plural memory cells MC arranged in the Z direction correspond to the plural memory cells MC (refer to FIG. 2) included in the memory string MS. Plural memory cells MC arranged in the XYZ direction are formed at plural intersection positions where the plural conductive layers 102 and the plural columnar bodies CL intersect each other.

The conductive film BL_1 extends in the Y direction. The −Z side surface of the conductive film BL_1 is connected to the electrode PD2 with the plug CP6 interposed therebetween. A −Z side surface of the electrode PD2 is exposed to the bonding surface BF1. The electrode PD2 is connected to the electrode PD1 at the bonding surface BF1. In FIG. 9, for the sake of simplicity, the configuration in which the Y positions of the plug CP6, the electrode PD2, and the electrode PD1 are included in a width of the stacked body SST1 in the Y direction is exemplified, but the Y positions of the plug CP6, the electrode PD2, and the electrode PD1 may be positions shifted in the Y direction from the stacked body SST1.

As illustrated in FIG. 9, the semiconductor film CH of the columnar body CL of the memory cell array 11_1 is electrically connected to a transistor Tr-1 of the chip 10 via the bit line BL1. The semiconductor CH of the columnar body CL of the memory cell array 11_2 is electrically connected to a transistor Tr-2 of the chip 10 via the bit line BL_2. The connection from the memory cell array 11_1 to the transistor Tr-1 via the bit line BL_1 and the connection from the memory cell array 11_2 to the transistor Tr-2 via the bit line BL_2 are insulated from each other.

As described above, in the embodiment, in the semiconductor memory device 1, the connection configuration (source connection line CSL_1) from the conductive layer 103 that the tip of the semiconductor film CH of the chip 10_1 reaches to the transistor Tr of the chip 20 and the connection configuration (source connection line CSL_2) from the conductive layer 103 that the tip of the semiconductor film CH of the chip 10_2 reaches to the transistor Tr of the chip 20 are insulated from each other. The connection configuration (bit line BL_1) from the rear end of the semiconductor film CH of the chip 10_1 to the transistor Tr of the chip 20 and the connection configuration (bit line BL_2) from the rear end of the semiconductor film CH of the chip 10_2 to the transistor Tr of the chip 20 are insulated from each other. As a result, application of an erasing voltage to the memory cell MC through the driving of the source line SL_1 and the bit line BL_1 and application of an erasing voltage to the memory cell MC through the driving of the source line SL_2 and the bit line BL_2 can be performed independently of each other. That is, different erasing operations can be performed independently of each other in the memory cell array 11_1 and the memory cell array 11_2. Accordingly, different functions regarding the erasing operation can be implemented in the memory cell array 11_1 and the memory cell array 11_2, and the memory cell array 11_1 and the memory cell array 11_2 can be selectively used depending on the application.

Note that the configuration for separately driving the word lines WL in the memory cell array 11_1 and the memory cell array 11_2 while the word lines WL are connected in common is not limited to the configuration in which the source connection lines CSL are independently connected and the bit lines BL are independently connected while the select gate lines SGD and SGS are connected in common. The source connection line CSL may be independently connected, the bit line BL may be independently connected, and the select gate line SGS may be independently connected while the select gate line SGD is connected in common. The source connection line CSL may be independently connected, the bit line BL may be independently connected, and the select gate line SGD may be independently connected while the select gate line SGS is connected in common. The source connection line CSL may be independently connected, the bit line BL may be independently connected, the select gate line SGD may be independently connected, and the select gate line SGD may be independently connected.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a first chip;
    a second chip bonded to the first chip; and
    a third chip bonded to the second chip on an opposite side of the first chip, wherein
    the first chip includes
        plural first conductive layers stacked with a first insulating layer interposed therebetween,
        plural first semiconductor films, each extending in a stack direction through the plural first conductive layers, and
        plural first insulating films, each being disposed between the plural first conductive layers and a first semiconductor film of the plural first semiconductor films,
    the first chip having plural memory cells provided at plural intersection positions where the plural first conductive layers and the plural first semiconductor films intersect each other,
    the second chip includes
        plural second conductive layers stacked with a second insulating layer interposed therebetween,
        plural second semiconductor films, each extending in the stack direction through the plural second conductive layers, and
        plural second insulating films, each being disposed between the plural second conductive layers and a second semiconductor film of the plural second semiconductor films,
    the second chip having plural memory cells provided at plural intersection positions where the plural second conductive layers and the plural second semiconductor films intersect each other, and
    a first connection configuration and a second connection configuration being insulated from each other, the first connection configuration reaching the third chip from a first conductive layer that a tip of the first semiconductor film reaches among the plural first conductive layers, the second connection configuration reaching the third chip from a second conductive layer that a tip of the second semiconductor film reaches among the plural second conductive layers.

2. The semiconductor memory device according to claim 1, wherein the first connection configuration includes a first plug that extends in the stack direction in the first chip and reaches the first conductive layer that the tip of the first semiconductor film reaches, and the second connection configuration includes
a second plug that extends in the stack direction in the first chip and penetrates the first conductive layer that the tip of the first semiconductor film reaches in an insulated state, and
a third plug that extends in the stack direction in the second chip and reaches the second conductive layer that the tip of the second semiconductor film reaches.

3. The semiconductor memory device according to claim 1, wherein
a third connection configuration from a rear end of the first semiconductor film of the first chip to the third chip and a fourth connection configuration from a rear end of the first semiconductor film of the second chip to the third chip are insulated from each other.

4. The semiconductor memory device according to claim 1, wherein
a third conductive layer that covers the first conductive layer that the tip of the first semiconductor film reaches and a fourth conductive layer that covers the second conductive layer that the tip of the second semiconductor film reaches respectively contain different materials.

5. The semiconductor memory device according to claim 4, wherein
the fourth conductive layer includes a first conductor, and
the third conductive layer includes a second conductor having a resistivity lower than a resistivity of the first conductor.

6. The semiconductor memory device according to claim 5, wherein
the first conductor includes a conductor containing aluminum as a main component, and
the second conductor contains a conductor containing copper as a main component.

7. The semiconductor memory device according to claim 1, wherein
a voltage of the first conductive layer that the tip of the first semiconductor film reaches among the plural first conductive layers and a voltage of the second conductive layer that the tip of the second semiconductor film reaches among the plural second conductive layers are controllable independently of each other.

8. The semiconductor memory device according to claim 7, wherein
the first chip further includes a first conductive film disposed on a side of the third chip with respect to the plural first conductive layers and connected to a rear end of the first semiconductor film,
the second chip includes a second conductive film disposed on a side of the first chip with respect to the plural second conductive layers and connected to a rear end of the second semiconductor film, and
a voltage of the first conductive film and a voltage of the second conductive film are controllable independently of each other.

9. The semiconductor memory device according to claim 1, wherein
a data erasing operation is executable by selecting at least one of the plural memory cells of the first chip and the plural memory cells of the second chip.

10. The semiconductor memory device according to claim 1, wherein
a data erasing operation is executable by selecting the plural memory cells of the first chip and unselecting the plural memory cells of the second chip.

11. The semiconductor memory device according to claim 1, wherein
a data erasing operation is executable by unselecting the plural memory cells of the first chip and selecting the plural memory cells of the second chip.

12. The semiconductor memory device according to claim 1, wherein application of an erasing voltage to the memory cell of the first chip and application of an erasing voltage to the memory cell of the second chip are executable independently of each other.

13. The semiconductor memory device according to claim 1, wherein
an erasing operation in which an erasing time of data of the memory cell of the first chip and an erasing time of data of the memory cell of the second chip are different from each other is executable.

14. The semiconductor memory device according to claim 13, wherein
the erasing time of the data of the memory cell of the first chip and the erasing time of the data of the memory cell of the second chip are different from each other according to a difference between a wiring load of the first connection configuration and a wiring load of the second connection configuration.

15. The semiconductor memory device according to claim 14, wherein
the erasing time of the data of the memory cell of the first chip and the erasing time of the data of the memory cell of the second chip are different from each other according to a difference between a parasitic capacitance of the first connection configuration and a parasitic capacitance of the second connection configuration.

16. The semiconductor memory device according to claim 14, wherein
the erasing time of the data of the memory cell of the first chip and the erasing time of the data of the memory cell of the second chip are different from each other according to a difference between a parasitic resistance of the first connection configuration and a parasitic resistance of the second connection configuration.

17. The semiconductor memory device according to claim 1, wherein
an erasing operation in which an erasing voltage of data of the memory cell of the first chip and an erasing voltage of data of the memory cell of the second chip are different from each other is executable.

18. The semiconductor memory device according to claim 17, wherein
the erasing voltage of the data of the memory cell of the first chip and the erasing voltage of the data of the memory cell of the second chip are different from each other according to a difference between a wiring load of the memory cell of the first chip and a wiring load of the memory cell of the second chip.

19. The semiconductor memory device according to claim 18, wherein
the erasing voltage of the data of the memory cell of the first chip and the erasing voltage of the data of the memory cell of the second chip are different from each other according to a difference between a parasitic capacitance of the first connection configuration and a parasitic capacitance of the second connection configuration.

20. The semiconductor memory device according to claim 18, wherein
the erasing voltage of the data of the memory cell of the first chip and the erasing voltage of the data of the memory cell of the second chip are different from each other according to a difference between a parasitic resistance of the first connection configuration and a parasitic resistance of the second connection configuration.

* * * * *